(12) United States Patent
Shigeta

(10) Patent No.: US 6,697,981 B2
(45) Date of Patent: Feb. 24, 2004

(54) SYSTEM AND METHOD FOR EVALUATING THE LOCATION OF A FAILURE IN A LOGIC CIRCUIT, AND MACHINE-READABLE RECORDING MEDIUM HAVING A RECORDED PROGRAM

(75) Inventor: Kazuki Shigeta, Tokyo (JP)

(73) Assignee: NEC Corporation, Tokyo (JP)

( * ) Notice: Subject to any disclaimer, the term of this patent is extended or adjusted under 35 U.S.C. 154(b) by 495 days.

(21) Appl. No.: 09/770,186

(22) Filed: Jan. 29, 2001

(65) Prior Publication Data

US 2001/0011360 A1 Aug. 2, 2001

(30) Foreign Application Priority Data

Jan. 28, 2000 (JP) ........................................ 2000-019879

(51) Int. Cl.$^7$ ............................................ G01R 31/3193
(52) U.S. Cl. ........................................................ 714/736
(58) Field of Search ........................................ 714/736

(56) References Cited

U.S. PATENT DOCUMENTS 6,397,362 B1 * 5/2002 Ishiyama .................... 714/736

FOREIGN PATENT DOCUMENTS

| JP | 05-298387 | 11/1993 | | |
|---|---|---|---|---|
| JP | 2655105 | 5/1997 | | |
| JP | 2921502 | 4/1999 | | |
| JP | 11-153646 | 6/1999 | | |
| JP | 11-153646 A | 6/1999 | | |
| JP | 11045920 A | * 9/1999 | ......... | G01R/31/302 |
| JP | 2000304820 A | * 11/2000 | ........... | G01R/31/28 |
| JP | 2000314760 A | * 11/2000 | ........... | G01R/31/28 |

* cited by examiner

Primary Examiner—R. Stephen Dildine
(74) Attorney, Agent, or Firm—Sughrue Mion, PLLC

(57) ABSTRACT

In evaluating the location of a failure in a logic circuit including gates defined in a hierarchical manner, the present invention discloses a system capable of evaluating the location of a failure by referring to the circuitry of a gate described by a basic gate without creating any special databases that are dedicated to evaluating the location of a failure. In this system, expected value setting device obtains an expected value of a target gate inside the logic circuit by an IF-THEN operation in an output direction, logical state evaluating device obtains a logical state of the target gate inside the logic circuit by an IF-THEN operation in an input/output direction, and a failure propagation path inside the target gate is obtained by comparing the expected value with the logical state. Furthermore, temporary decided line retrieving device retrieves an input terminal of the target gate, a temporary logical value being set thereon, by referring to the circuitry of the target gate recorded in a logic circuitry storage unit, and the expected value and the logical state inside the target gate recorded in a logical state storage unit, and then related failure terminal setting device obtains a related failure terminal in the input/output terminal of the target gate by referring to the circuitry of the target gate recorded in the logic circuitry storage unit, and the expected value and the logical state inside the target gate recorded in the logical state storage unit, when no temporary decided lines are detected, and the target gate is determined to be an established gate.

26 Claims, 15 Drawing Sheets

SYSTEM AND METHOD FOR EVALUATING THE LOCATION OF A FAILURE IN A LOGIC CIRCUIT, AND MACHINE-READABLE RECORDING MEDIUM HAVING A RECORDED PROGRAM

BACKGROUND OF THE INVENTION

1. Field of the Invention

The present invention relates to a technology for evaluating the location of a failure in a logic circuit. More particularly, the invention relates to a system, a method, a device, and a recording medium for evaluating the location of a failure, which are suitably used for the evaluation of the location of a failure in a logic circuit including gates defined in a hierarchical manner.

2. Description of the Related Art

A system for evaluating the location of a failure is designed to evaluate a path possibly having a failure propagated therethrough, which may satisfy an output pattern including a failure output, and then evaluates a location of the failure based on such information. For example, as described in Japanese Patent Laid-Open Hei 08 (1996)-146093 (Patent No. 2655105), Japanese Patent Laid-Open Hei 10 (1998)-062494, and so on, this system can be used as a part of the failure location evaluating system of a sequential circuit. A technology described in each of such publications provides a system for evaluating the location of a failure, which is based on a path tracing method for evaluating a failure propagation path from a failure output terminal in an input direction.

In the case of evaluating a failure propagation path, it is necessary to obtain a logical state for each of the nodes (a gate, a signal line, and a terminal) inside a circuit. Here, description will be made with reference to a specific circuit. FIG. 18 shows a benchmark circuit C17 composed only of NAND gates. Hereinbelow, with respect to the circuit shown in FIG. 18, a method for evaluating a failure propagation path with L22=1 and L23=1 is described based on a method for extracting a failure propagation path, which the inventor of the present invention disclosed in Japanese Patent Laid-Open Hei 11 (1999)-153646. In FIG. 18, a parenthesized numeral denotes an expected value of each signal line.

First, since there is no signal line state implied by L22=1 and L23=1, a signal line is retrieved to set a temporary logical value. According to the failure propagation path extracting method of the foregoing publication of Japanese Patent Laid-Open Hei 11 (1999)-153646, a temporary logical value is set on an input signal line of a gate connected to a failure signal line, a state of the gate having yet to be unestablished (unestablished gate).

FIG. 20 shows an IF-THEN operation (implication operation) in the input/output direction of a two-input NAND gate. When a logical value of an output signal line is "1", and both of two logical values of the input signal lines are "X", a logical value of either one of the input signal lines should be "0". However, since it has yet to be established, the gate is determined to be an unestablished gate.

In the example shown in FIG. 18, a logical value "0" is temporarily set on L16, which is one of the input signal lines of a gate G23 connected to the failure signal line L23. With L16=0 being temporarily set, L2=1 and L11=1 are implicated by the IFTHEN operation of G16. Thereafter, the IF-THEN operation and the temporary setting of a logical value are repeated and, by temporarily setting logical values on the signal lines of two locations, three logical states are obtained as shown in the decision tree of FIG. 19. The obtained logical states inside the circuit describe the logical values of the respective signal lines in portions enclosed with squares of FIG. 19 in the order of (L1, L2, L3, L6, L7, L10, L11, L16, L19, L22, and L23). The underline below each logical value represents a failure propagation path, in which an expected value is different from the logical value.

Each signal line on the failure propagation path obtained by the foregoing method becomes a failure location candidate, which is an origin for propagating a failure state to the failure output of the logic circuit.

The foregoing publications of Japanese Patent Laid-Open Hei 08 (1996)-146093, and Patent Laid-Open Hei 10 (1998)-062494 disclose the method of deciding a priority order among a failure candidates by weighting a failure propagation path evaluated according to a rule. One example is given hereinbelow. It is assumed for example that a failure propagation path like that shown in FIG. 21 has been obtained. In this case, by calculating the number of failure output terminals as a weight, to which an error state may propagate, the parenthesized numerals are obtained as shown in FIG. 21 when a failure is present in each path.

This weight can be obtained by transmitting the information about a failure output terminal in an input direction. On a path p1, there is a possibility of propagating failures to four failure output terminals (F1 to F4), and a weight becomes a maximum value 4. Accordingly, it can be determined that the possibility of a failure present in the path p1 is high.

As can be understood from the foregoing, the following three processings must be carried out for each gate with regard to the process for evaluating the location of a failure based on path tracing:

(1) an IF-THEN operation in an input/output direction based on the function of each gate;

(2) determination of an unestablished gate, and retrieval of a signal line, a temporary logical value being set thereon; and (3) transmission of information regarding a related failure output terminal to the input side.

It has conventionally been considered that when the location of a failure is evaluated based on path tracing by setting a logic circuit including a user-defined gate serving as a target, the user must prepare a database for each gate for realizing the above three processings, and incorporate the database in a system. For such a user-defined gate, a hierarchical circuitry for logic simulation has been prepared, whereas no databases, in which process for evaluating a failure location is defines, have not.

Consequently, when the number of user-defined gates is increased, the number of databases to be prepared becomes enormous, as a result, a great deal of time and labor are required. In addition, as in the case of a flip-flop (FF), complicated processing must be taken into consideration, where the logical state of an input/output terminal is extending over time points. Accordingly the preparation of databases by a failure analyzer, not a designer, is difficult.

In a circuit designing environment, for the user-defined gate, a hierarchical circuitry is described based on a hardware descriptive language such as Verilog or the like by a basic gate such as an AND, a NAND or the like to be evaluated, and kept in a library form. Thus, even those who are not circuit designers can carry out logic simulation.

Gate processing in the logic simulation can be realized only by an IF-THEN operation in an output direction. This is because a gate output logical state is uniquely set when a logical value of a gate input terminal is decided. However, determination of an unestablished gate necessary for the evaluation of a failure location, or transmission of information regarding a related failure output terminal cannot be realized only by such an IF-THEN operation in an output direction.

As is apparent from the foregoing, the following problems are inherent in the conventional a failure evaluating system.

A first problem is that a database dedicated to the process of evaluating the location of a failure needs to be created in the case of evaluating the location of a failure in the logic circuit including gates defined in a hierarchical manner.

This is because in the processing of each of the hierarchically defined gates for the evaluation of the location of a failure, the IF-THEN operation in the input/output direction, the retrieval of a signal line, a temporary logical value being set thereon, and the transmission of information regarding a failure terminal are essential, and only a database for a basic gate is prepared in the failure location evaluating device.

A second problem is that the gate library describing a circuitry composed of the basic gates, which have been prepared for the logic simulation, cannot be utilized for the process of evaluating the location of a failure.

This is because there is no method provided for realizing the three processings essential for the evaluation of the location of a failure, that is, the IF-THEN operation in the input/output direction, the retrieval of a signal line, a temporary logical value being set thereon, and the transmission of information regarding a failure terminal.

A third problem is that it is difficult to create a database dedicated to the process of evaluating the location of a failure in the hierarchically defined FF (Flip-Flop).

This is because the logical state of he input/output terminal of FF (Flip-Flop) relates to two or more time points, which makes the processing complicated.

SUMMARY OF THE INVENTION

Thus, the present invention was made in consideration of the foregoing problems, and an object of the present invention is to provide a system, a method, and a recording medium for evaluating the location of a failure, capable of eliminating the necessity of creating a database dedicated to the evaluation of the location of a failure.

Another object of the present invention is to provide a system, a method, and a recording medium for evaluating the location of a failure, capable of utilizing a circuitry hierarchically defined for logic simulation.

Another object of the present invention is to provide a system, a method, and a recording medium for evaluating the location of a failure, capable of eliminating the necessity of creating a database dedicated to the evaluation of a failure location of a novel FF. These and other objects, features and advantages of the present invention will become apparent to those skilled in the related art upon reading the following description.

In order to achieve the foregoing objects, in accordance with a first aspect of the invention, a system for evaluating the location of a failure is adapted to evaluate logical states of the input/output terminal of a target gate and the inside thereof, retrieve an unestablished gate and a terminal, a temporary logical value being set thereon, and set information regarding the related failure terminal of the input/output terminal by utilizing the circuitry of the target gate hierarchically described by a basic gate.

More specifically, the system for evaluating the location of a failure comprises: expected value setting device (23 in FIG. 1) for evaluating the logical states of the input/output terminal of the target gate and the inside thereof; logical state setting device (24 in FIG. 1); temporary decided line retrieving device (25 in FIG. 1) for retrieving a terminal of a target gate serving as a target, a temporary logical value being set thereon, when no logical contradiction occurs; and related failure terminal setting device (26 in FIG. 1) for transmitting information regarding the related failure terminal of the input/output terminal of the target gate to an input side.

According to the present invention, a circuit portion related to the failure output terminal is extracted, and a failure propagation path inside the circuit portion is evaluated. Further, when necessary, another circuit portion side is extracted in the input side, and all failure propagation paths are evaluated. Then, based on connection information of the evaluated paths, a priority order (a failure probability) is calculated among failure candidates on the path, and a list of a failure candidates in the logic circuit is output.

In accordance with a second aspect of the present invention, a system for evaluating the location of a failure is adapted to evaluate all failure propagation paths inside a target gate, obtain a terminal, a temporary logical value being set thereon, and a logical state at this time, and set information regarding the related failure terminal of an input/output terminal, by utilizing the circuitry of the target gate hierarchically described by a basic gate.

More specifically, the system for evaluating the location of a failure comprises: expected value setting device (23 in FIG. 7) for setting expected values of the input/output terminal of the target gate and the inside thereof; a failure propagation path evaluating device (27 in FIG. 7) for evaluating all failure propagation paths inside the target gate; and related failure terminal setting device (26 in FIG. 7) for transmitting information regarding the related failure terminal of the input/output terminal of the target gate to an input side.

In accordance with a third aspect of the invention, a system for evaluating the location of a failure is adapted to evaluate logical states of the input/output terminal of a target gate and the inside thereof at two time points, retrieve a terminal, a temporary logical value being set thereon, and set information regarding the related failure terminal of the input/output terminal, by utilizing the circuitry of the target gate hierarchically described by a basic gate and a basic FF.

More specifically, the system for evaluating the location of a failure comprises: basic FF retrieving device (31 in FIG. 9) for retrieving the basic FF inside the target gate; expected value setting device (23 in FIG. 9) for setting logical states of the input/output terminal of the target gate at two time points and the inside thereof; logical state setting device (24 in FIG. 9); second temporary decided line retrieving device (35 in FIG. 9) for retrieving a terminal serving as a target, a temporary logical value being set thereon, by referring to the logical states inside the target gate of the two time points, when no logical contradiction occurs; and second related failure terminal setting device (36 in FIG. 9) for transmitting information regarding the related failure terminal of the input/output terminal of the target gate to an input side by tracing a failure propagation path extending over the two time points.

According to the present invention, the expected value setting device calculates an expected value inside the target gate composed of the basic gate by referring to the expected value of the input/output terminal, entered from an input device, and the circuitry of the target gate stored in a logic circuitry storage unit, and then records this value in a logical state storage unit. The calculation of the expected value is carried out based on an IF-THEN operation in an output direction for obtaining an output state from an input state.

According to the present invention, the logical state evaluating device calculates a logical state inside the target gate composed of the basic gate by referring to the logical value of the input/output terminal, entered from the input device, and the circuitry of the target gate stored in the logic circuitry storage unit, and then records this state in the logical state storage unit. The calculation of the logical state is carried out based on an IF-THEN operation in an input/output direction.

According to the present invention, the temporary decided line retrieving device retrieves an unestablished gate inside the target gate by referring to the circuitry of the target gate stored in the logic circuitry storage unit, and the expected value and the logical state inside the target gate recorded in the logical state storage unit, and retrieves an input signal line, a logical state thereof having yet to be established in the unestablished gate. The device further retrieves the input terminal of the target gate, a temporary logical value being set thereon, by tracing a signal line having an unestablished logical state from the input signal line in an input direction.

According to the present invention, the related failure terminal setting device retrieves a failure output terminal in the target gate by referring to the circuitry of the target gate stored in the logic circuitry storage unit, and the expected value and the logical state inside the target gate recorded in the logical state storage unit, traces a failure propagation path, in which expected and logical values are different from each other, from the failure output terminal in the input direction, and then adds information regarding the related failure terminal, which is set in the failure output terminal in the output side of the failure propagation path, to the failure input terminal in the input side of the failure propagation path.

According to the present invention, the failure propagation evaluating device evaluates a logical state and a failure propagation path inside the target gate by referring to the circuitry of the target gate stored in the logic circuitry storage unit, and the expected value and the logical state inside the target gate recorded in the logical state storage unit.

According to the present invention, the basic FF retrieving device retrieves the basic FF of the circuit of the target gate by referring to the circuitry of the target gate stored in the logic circuitry storage unit, and then retrieves the position of the basic FF in the circuit.

According to the present invention, the second temporary decided line retrieving device retrieves an unestablished gate inside the target gate by referring to the circuitry of the target gate recorded in the logic circuitry storage unit, and the expected value and the logical state of the two time points inside the target gate recorded in the logical state storage unit, and retrieves an input signal line, a logical state thereof having yet to be established in the unestablished gate. This device further retrieves the input terminal of the target gate, a temporary logical value being set thereon, by tracing a signal line having a logical state unestablished from the input signal line in the input direction. When reaching at the basic FF during the tracing of the signal line, the tracing is continued going back in time by referring to the input clock signal of the basic FF.

According to the present invention, the second related failure terminal setting device retrieves a failure output terminal in the target gate by referring to the circuitry of the target gate recorded in the logic circuitry storage unit, and the expected value and the logical state of the two time points inside the target gate recorded in the logical state storage unit. Then, this device traces a failure propagation path, in which expected and logical values are different from each other, from the failure output terminal in the input direction, and then adds information regarding a related failure terminal set in the failure output terminal in the output side of the failure propagation path to the failure input terminal in the input side of the failure propagation path. When reaching at the basic FF during the tracing of the failure propagation path, the tracing is continued going back in time by referring to the input clock signal of the basic FF.

DESCRIPTION OF THE PREFERRED EMBODIMENTS

Next, the preferred embodiments of the present invention will be described with reference to the accompanying drawings. The present invention functions as a failure location evaluating system of a gate having a circuitry described by a basic gate, or as a part of a failure location evaluating device of a sequential circuit, which executes processing of each gate. The invention makes it possible to perform processing including the IF-THEN operation of a logical state, the determination of a temporary decided line, and the setting of a related failure output terminal by referring to the circuitry described by the basic gate.

[First Embodiment of the Invention]

Figure 1:
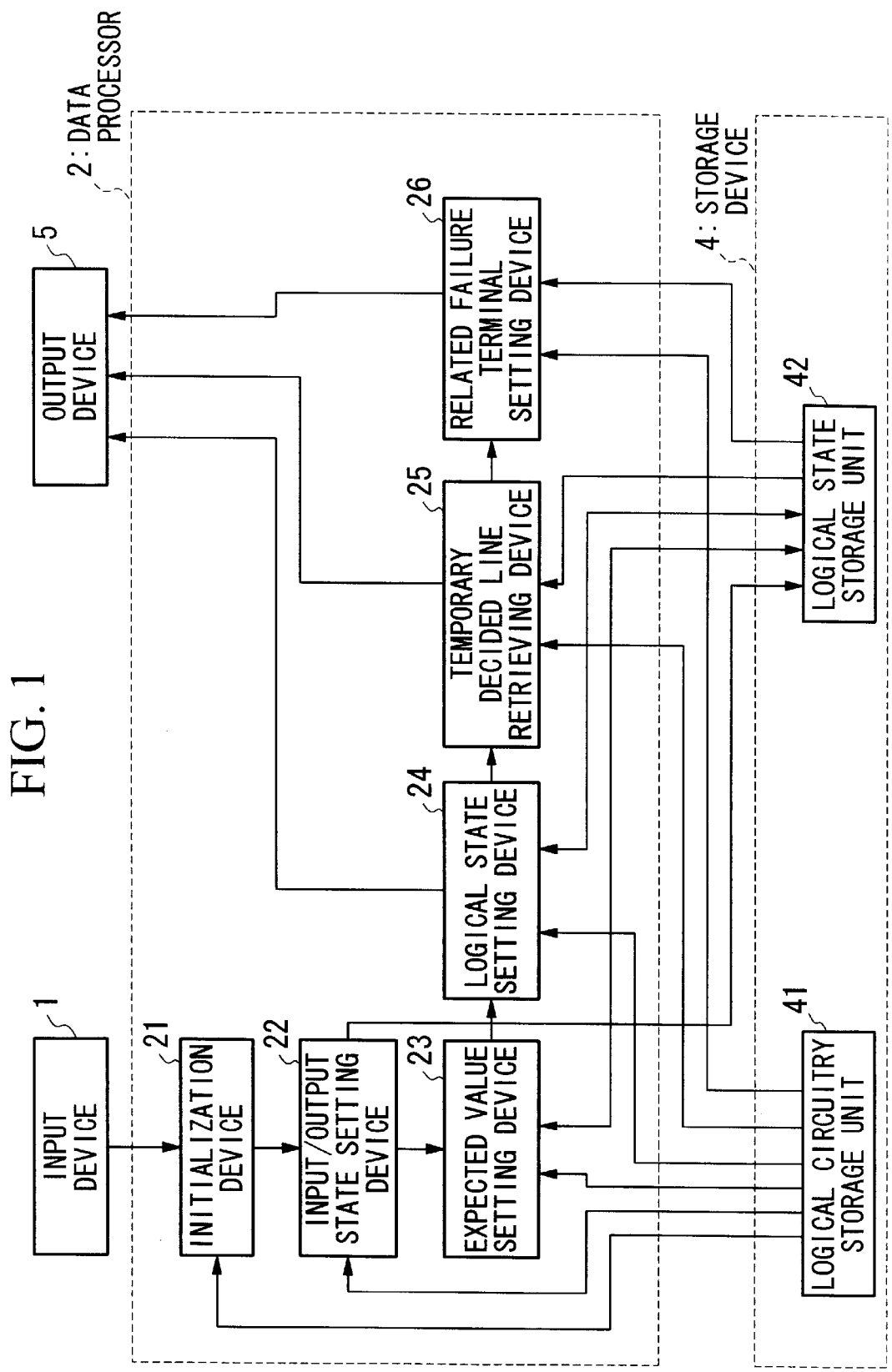
FIG. 1 is a constitutional view of a first embodiment of the present invention.

FIG. 1 illustrates the constitution of a device according to a first embodiment of the invention. In FIG. 1, the first embodiment of the invention comprises: a key board, or an input device 1 serving as an interface portion of a host a failure location evaluating device; a data processor 2 operated by program control; a storage device 4 for storing information; and a display device, a printer or an output device 5 serving as an interface portion of the host a failure location evaluating device.

The storage device 4 includes: a logic circuitry storage unit 41; and a logical state storage unit 42.

In the logic circuitry storage unit 41, the circuitry of each gate is prestored, that is,
a kind of a basic gate;
a connecting relation between the basic gate and a signal line inside the gate; and
the rule of an IF-THEN operation for the basic gate.

The logical state storage unit 42, stores:
a logical state of each signal line being processed; and
a logical state (expected value) of each signal line when the circuit is normal.

The data processor 2 includes: initialization device 21; input/output state setting device 22; expected value setting device 23; logical state evaluating device 24; temporary decided line retrieving device 25; and related failure terminal setting device 26.

Figure 4:
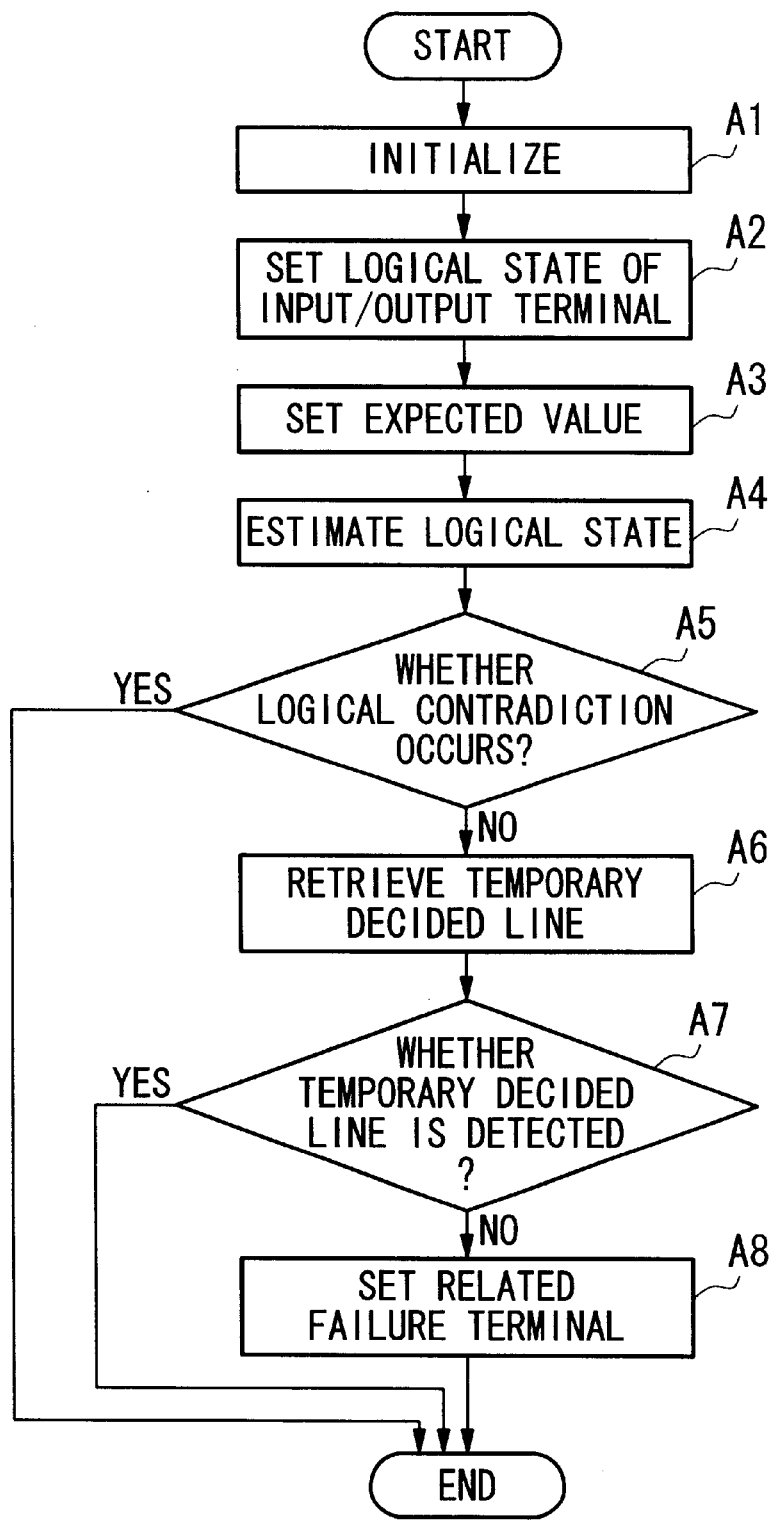
FIG. 4 is a flowchart showing an operation of the first embodiment of the present invention.

The initialization device 21 selects a logic circuitry by referring to the logic circuitry storage unit 41 based on the kind of a target gate provided from the input device 1, and then executes initialization (step A1 in FIG. 4).

The input/output state setting device 22 sets expected and logical values of the input/output terminal of the target gate, and information regarding a related failure terminal provided from the input device 1, to the input/output terminal of the circuitry by referring to the logic circuitry storage unit 41, and then records the same in the logical state storage unit 42 (step A2 in FIG. 4).

The expected value setting device 23 obtains an expected value inside the target gate composed of a basic gate, by referring to the expected value of the input/output terminal set by the input/output state setting device 22 and recorded in the logical state storage unit 42, and the logic circuitry storage unit 41, and then records the obtained expected value in the logical state storage unit 42 (step A3 in FIG. 4). The processing for obtaining the expected value is performed by executing an IF-THEN operation in an output direction to obtain an output state in accordance with an input state.

The logical state evaluating device 24 calculates a logical state inside the target gate composed of the basic gate by referring to the logical value of the input/output terminal set by the input/output state setting device 22 and recorded in the logical state storage unit 42, and the logic circuitry storage unit 41, and then records the calculated logical state in the logical state storage unit 42 (step A4 in FIG. 4). The calculation of the logical state is performed by executing an IF-THEN operation in an input/output direction. In the case where any logical contradiction is detected during evaluation (branch Y of step A5 in FIG. 4), then the process is finished.

The temporary decided line retrieving device 25 retrieves an input terminal, a temporary logical value being set thereon, by referring to the circuitry of the target gate recorded in the logic circuitry storage unit 41, and the expected value and the logical state inside the target gate recorded in the logical state storage unit 42 (step A6 in FIG. 4). The obtained input terminal of the target gate, a temporary logical value being set thereon, is output to the output device 5, and then the process is finished. In the case that no temporary decided line is found (branch N of step A7 in FIG. 4), then the process moves to the related failure terminal setting device 26.

The related failure terminal setting device 26 obtains a related failure terminal in the output terminal of the target gate by referring to the circuitry of the target gate recorded in the logic circuitry storage unit 41, and the expected value and the logical state inside the target gate recorded in the logical state storage unit 42 (step A7). This obtained related failure terminal is output to the output device 5, and then the process is finished.

Figure 2:
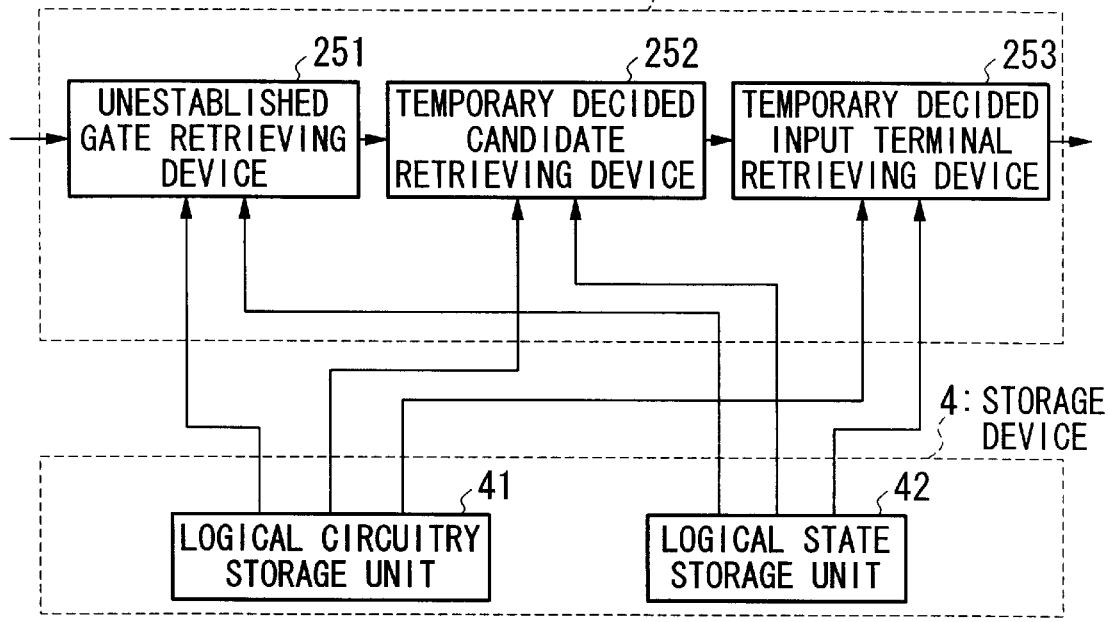
FIG. 2 is a constitutional block diagram of the first embodiment of the present invention.

Next, the constitution of the temporary decided line retrieving device 25 according to the first embodiment of the present invention will be described in detail by referring to FIG. 2. As shown in FIG. 2, the temporary decided line retrieving device 25 includes: unestablished gate retrieving device 251; temporary decided candidate retrieving device 252; and temporary decided input terminal retrieving device 253.

The unestablished gate retrieving device 251 retrieves an unestablished gate having an output terminal connected to a failure propagation path, by referring to the circuitry and the rule of the IF-THEN operation of the basic gate recorded in the logic circuitry storage unit 41, and the logical value of each signal line inside the target gate stored in the logical state storage unit 42. For example, in the case of a NAND gate, in the case that no input signals are established when an output signal is "1", at least one of the input signals is "0", but which input signal is "0" is indefinite. Accordingly, such a gate is determined to be an "unestablished gate".

The temporary decided candidate retrieving device 252 retrieves an input terminal, a logical state thereof having yet to be unestablished, as a temporary decided candidate in the unestablished gate retrieved by the unestablished gate retrieving device 251, by referring to the logic circuitry storage unit 41 and the logical state storage unit 42.

The temporary decided input terminal retrieving device 253 traces a signal line ("U" (Unknown) or "X"), a logical state thereof have yet to be unestablished, in an input direction from the temporary decided candidate retrieved by the temporary decided candidate retrieving device 252 in the circuit of the target gate until the tracing reaches at the input terminal of the target gate, by referring to the logic circuitry storage unit 41 and the logical state storage unit 42, and then sets one of the reached input terminals of the target gate as a temporary decided terminal.

Figure 3:
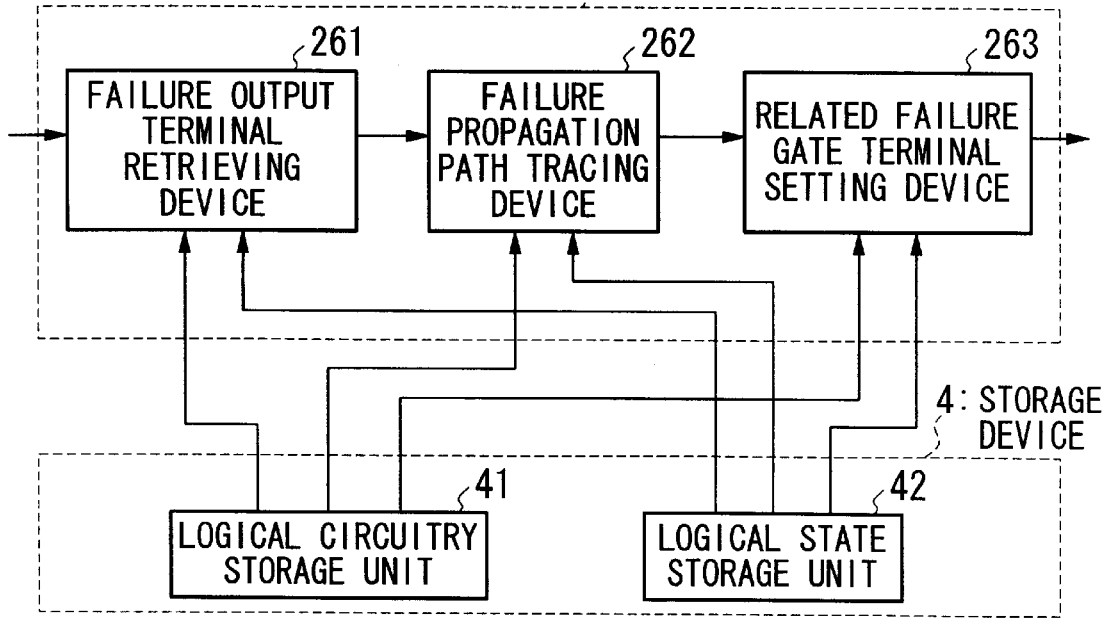
FIG. 3 is a constitutional view of the first embodiment of the present invention.

Next, the constitution of the related failure terminal setting device 26 according to the first embodiment of the present invention will be described in detail by referring to FIG. 3. As shown in FIG. 3, the related failure terminal setting device 26 includes: a failure output terminal retrieving device 261; a failure propagation path tracing device 262; and related failure gate terminal setting device 263.

The failure output terminal retrieving device 261 retrieves a failure output terminal, in which the output logical and expected values are different from each other in the output terminal of the target gate, by referring to the circuitry recorded in the logic circuitry storage unit 41, and the logical and expected values of the target gate stored in the logical state storage unit 42.

The failure propagation path tracing device 262 traces a failure propagation path in an input direction until the tracing reaches the input terminal of the target gate from a starting point which is the failure output terminal retrieved by the failure output terminal retrieving device 262, by referring to the logic circuitry storage unit 41 and the logical state storage unit 42.

The related failure gate terminal setting device 263 adds information regarding a related failure terminal to a failure input terminal in the input side by referring to the logic circuitry storage unit 42 and the logical state storage unit 42. Note that the related failure terminal has been set in the failure output terminal in the output side of the failure propagation path, which is traced by the failure propagation path tracing device 262.

Advancement of the foregoing units can be easily achieved by incorporating these as library chips in the failure evaluating device. High-speed processing can also be expected by composing the storage device 4 of a memory, and incorporating this as a system LSI.

Figure 5:
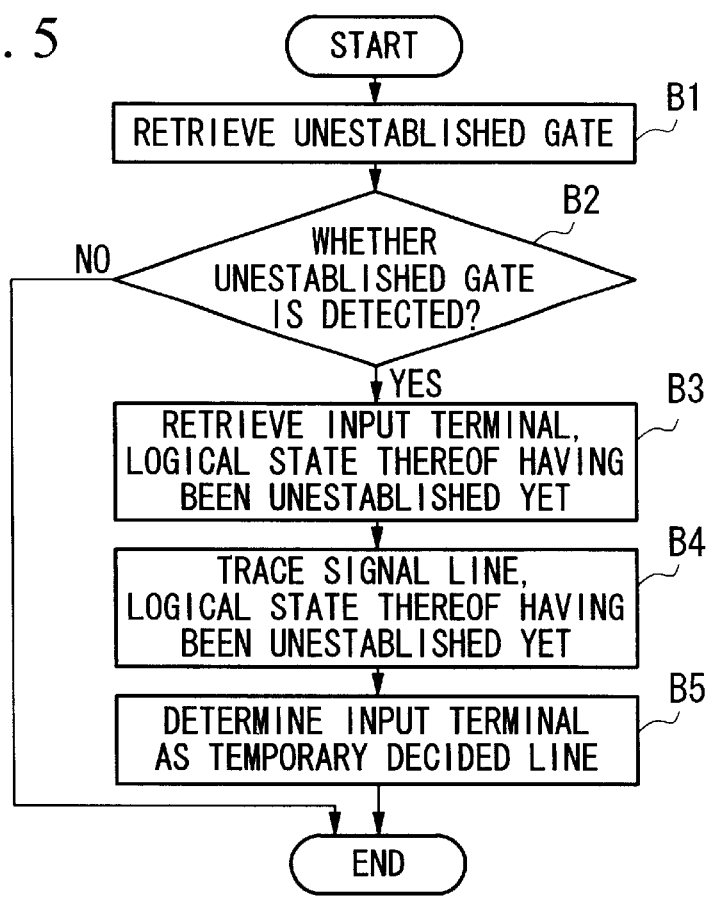
FIG. 5 is a flowchart showing an operation of the first embodiment of the present invention.
Figure 6:
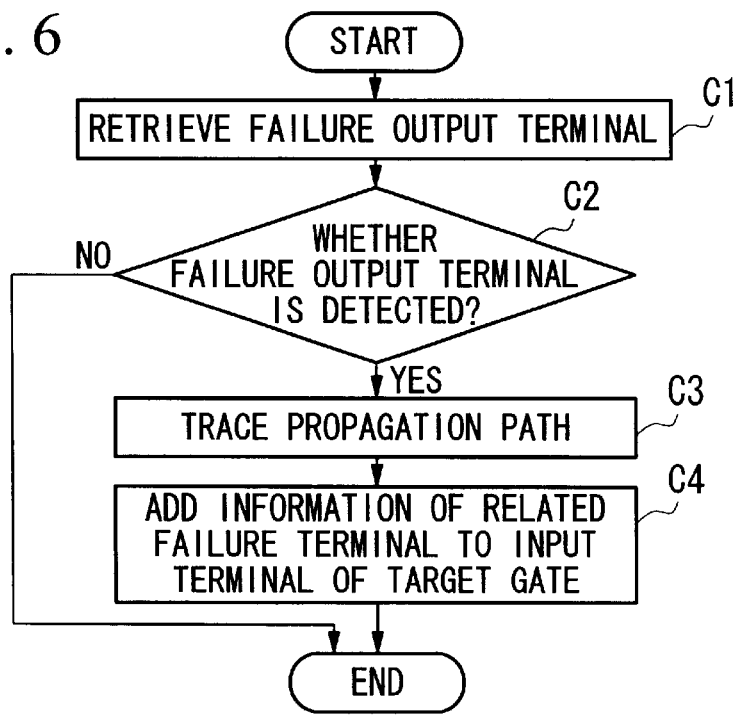
FIG. 6 is a flowchart showing an operation of the first embodiment of the present invention.

Each of FIGS. 4 to 6 is a flowchart showing the procedure of the first embodiment of the present invention. Now, the operation of the first embodiment of the invention will be described by referring to FIGS. 1 to 6.

In the initialization device 21, the logic circuitry of the target gate recorded in the logic circuitry storage unit 41 is selected based on information regarding the kind of the target gate, provided from the input device 1, and then initialization is carried out (step A1 in FIG. 4).

Subsequently, in the input state setting device 22, the logical and expected values of the input/output terminal and information regarding a related failure terminal, which are provided from the input device 1, are set in the input/output terminal of the logic circuitry selected by the initialization device 21, and then recorded in the logical state storage unit 42 (step A2).

Then, in the expected value setting device 23, an expected value inside the logic circuit of the target gate is obtained by executing an IF-THEN operation in an output direction (step A3).

Then, in the logical state evaluating device 24, a logical state inside the logic circuit of the target gate is obtained by executing an IF-THEN operation in an input/output direction.

By comparing the logical state with the expected value obtained in step A3 of FIG. 4, a failure propagation path inside the target gate can be obtained (step A4).

In the case where any logical contradiction occurs during processing, then the process is finished (step A5).

In the case where no logical contradiction occurs in step A4 of FIG. 4, in the temporary decided line retrieving device 25, the input terminal of the target gate, a temporary logical value being set thereon, is retrieved by referring to the circuitry of the target gate recorded in the logic circuitry storage unit 41, and the expected value and the logical state inside the target gate recorded in the logical state storage unit 42 (step A6).

In the case where a temporary decided line is detected, then the obtained input terminal of the temporary decided line is output to the output device 5, and the process is finished (step A7).

In this case, when the input terminal of the target gate, a temporary logical value being set thereon, is detected, it means that the target gate is an unestablished gate.

Conversely, when the above input terminal is not detected, it means that the target gate is an established gate, making it unnecessary to execute temporary logical value setting.

When no temporary decided lines are detected in step A6 of FIG. 4, and the target gate is determined to be an established gate, in the related failure terminal setting device 26, a related failure terminal in the input/output terminal of the target gate is obtained by referring to the circuitry of the target gate recorded in the logic circuitry storage unit 41, and the expected value and the logical state inside the target gate, recorded in the logical state storage unit 42. Then, the obtained related failure terminal is output to the output device 5 and the processing is finished (step A8).

FIG. 5 is a flowchart showing the procedure of the temporary decided line retrieval of step A6. Now, the processing in the temporary decided line retrieving device 25 will be described in detail by referring to FIG. 2 and the flowchart of FIG. 5.

First, in step B1, an unestablished gate having an output terminal connected to the failure propagation path is retrieved by referring to the circuitry and the rule of the IF-THEN operation for the basic gate recorded in the logic circuitry storage unit 41, and the logical value of each signal line inside the target gate stored in the logical state storage unit 42. For example, in the case of a NAND gate, when an output signal is "1" and input signals are unestablised, at least one of the input signals is "0". However, since it is unclear as to which of the input signals is "0", the gate is determined to be an "unestablished gate".

Subsequently, in step B2, conditional branch is executed depending on whether the unestablished gate is detected in step B1. If detected, then the process proceeds to step B3. If not detected, then the temporary decided line retrieval (step A6) is finished.

Then, in the temporary decided candidate retrieving device 252, an input terminal, a logical state thereof having yet to be unestablished, is retrieved as a temporary decided candidate in the unestablished gate retrieved by the unestablished gate retrieving device 252, by referring to the logic circuitry storage unit 41 and the logical state storage unit 42 (step B3).

In the temporary decided input terminal retrieving device 253, a signal line, a logical state thereof having yet to be unestablished, is traced in an input direction from the temporary decided candidate obtained in step B3 until the tracing reaches at the input terminal of the target gate, by referring to the logic circuitry storage unit 41 and logical state storage unit 42. One of the reached input terminals of the target gate is then set as a temporary decided terminal.

In the host, a failure location evaluating device, a temporary logical value is set on the signal line, which is set as a temporary decided line, connected to the obtained temporary decided terminal.

FIG. 6 is a flowchart showing the procedure of the related failure terminal setting in step A8 of FIG. 4. Now, the processing in the related failure terminal setting device 26 will be described in detail by referring to FIGS. 3 and 6.

First, in the failure output terminal retrieving device 261, a failure output terminal, in which a logical value and an expected value differ from each other at the output terminal of the target gate, is retrieved by referring to the circuitry recorded in the logic circuitry storage unit 41, and the logical and expected values of the target gate recorded in the logical state storage unit 42 (step C1 in FIG. 6).

Then, in step C2, a conditional branch is executed depending on whether the failure output terminal is detected in step C1. If detected, the process proceeds to step C3. If not detected, then the related failure terminal setting is finished.

In step C3, in the failure propagation path tracing device 262, the failure propagation path is traced in an input direction from the starting point which is the failure output terminal retrieved by the failure output terminal retrieving device 261 until the tracing reaches at the input terminal of the target gate, by referring to the logic circuitry storage unit 41 and logical state storage unit 42.

The related failure gate terminal setting device 263 adds information regarding a related failure terminal to a failure input terminal in the input side by referring to the logic circuitry storage unit 42 and the logical state storage unit 42 (step C4). Note that the related failure terminal has been set in the failure output terminal in the output side of the failure propagation path, which is traced by the failure propagation path tracing device 262.

As can be understood from the foregoing, by using the hierarchically defined circuitry composed of the basic gates, it is possible to process the target gate in the evaluation of the location of a failure.

Moreover, it is possible to treat the above-described gate as a basic gate in another hierarchically defined gate.

EXAMPLE 1

Now, in order that the foregoing embodiment is described in more detail according to an example, a first example of the present invention will be described in detail with reference to FIGS. 1 to 6, and 8. The constitution and the procedure of the first example of the invention are similar to those of the embodiment described above with reference to FIGS. 1 to 6, and thus description thereof will be omitted. A specific example described hereinbelow is the application of the invention to the case that a logic circuit targeted by the failure location evaluating device includes a circuit C17 serving as a gate shown in FIG. 18.

Now, consideration is given to the case of performing an IF-THEN operation for the input/output terminal of the target gate C17, retrieving a temporary decided line, and setting of a related failure terminal during the evaluation of the location of a failure.

In this case, the logical states of signal lines are represented by the four values "0", "1", "U (Unknown)", and X (Don't Care)". However, it should be understood that the invention is not limited to such four values, and it is applicable when logical values are represented in different manners.

The logical state "U (Unknown)" indicates an indefinite state, in which a logical state of a line is "0" or incapable of being decided at "0".

The logical state "X (Don't Care)" indicates one permitting both "0" and "1" logical states when no logical state contradiction occurs in the entire logic circuit for both "0" and "1" logical sates of a line.

It is now assumed as an initial state that the expected value of the input/output terminal of the target gate C17 and the logical value of an output signal (L22=1, and have been given.

Figure 18:
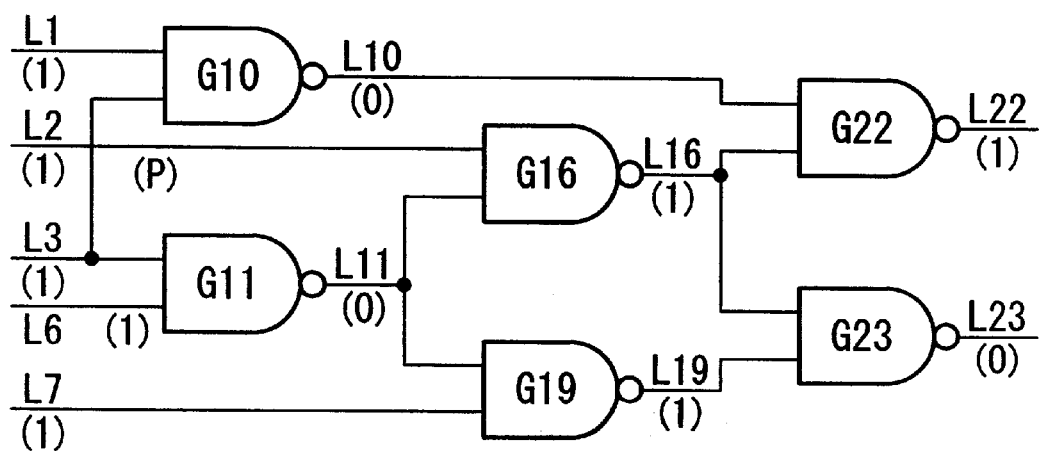
FIG. 18 is a view illustrating a conventional technology.

First, in the initialization device 21 of FIG. 1, the circuitry of the target gate C17 is taken out by referring to the logic circuitry storage unit 41, and a circuit composed of basic gates shown in FIG. 18 is obtained.

The logical states of the input/output terminal and the signal line are initialized (step A1 in FIG. 4).

Then, in the input/output state setting device 22, logical and expected values of the input/output terminal of the target gate C17 are set.

The followings are then set, i.e., L1=X[1], L2=X[1], L3=X[1], L6=X[1], L7=X[1], L22=1[1], and L23=1[0]. Each of bracketed numerals denotes an expected value (step A2 in FIG. 5).

In step A3 of FIG. 4, an IF-THEN operation of an output direction is executed by the expected value setting device 23 to obtain an expected value inside the logic circuit of the target gate.

Figure 20:
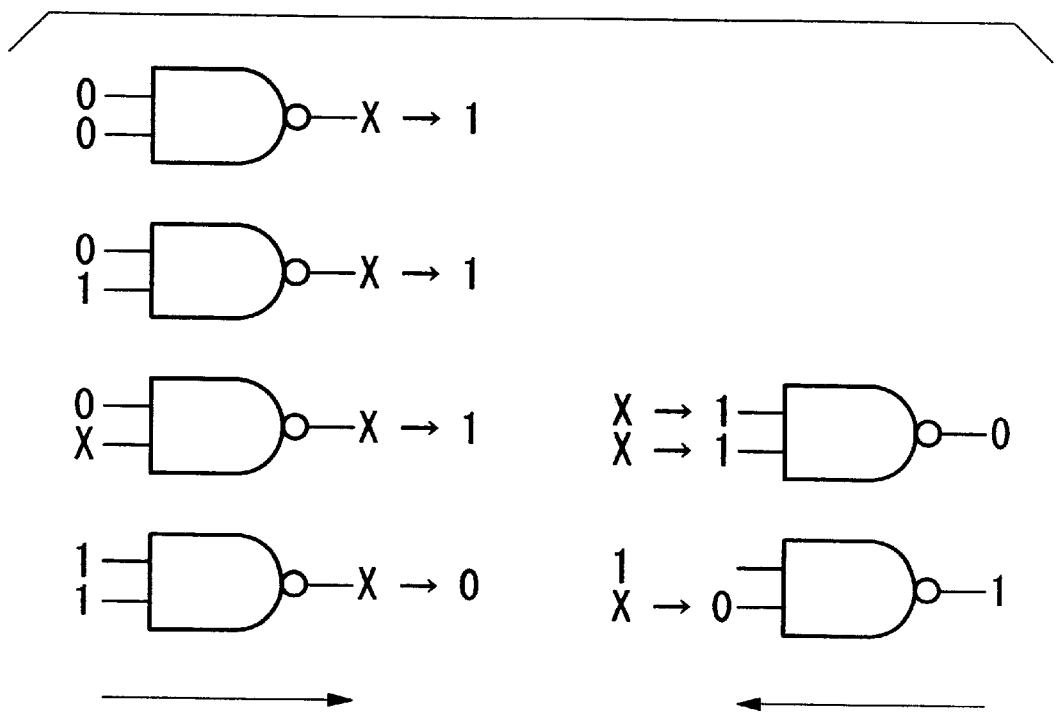
FIG. 20 is a view illustrating a conventional technology.

The IF-THEN operation of the output direction is executed by referring to the expected values of the input terminals (L1, L2, L3, L6 and L7) of FIG. 18, and the rule of an IF-THEN operation for the NAND gate serving as a basic gate (see FIG. 20).

For example, at G10 of FIG. 18, since input signals are (L1=1, and L3=1), the logical value of an output signal line L10 is implicated to be "0" according to the rule of the IF-THEN operation shown in FIG. 2.

By performing IF-THEN operations for all the gates, the expected values of all the signal lines are obtained. Note that each parenthesized numeral in FIG. 18 denotes an expected value obtained in such a manner.

Subsequently, in step A4 of FIG. 4, the logical value of the signal line inside the logic circuit is obtained by the logical state setting device 24. In this case, there are no signal lines implicated by L22=1 and L23=1. Since no logical contradiction occurs, the presence of no logical contradiction is determined in step A5.

Then, in step A6 of FIG. 4, a temporary decided line is retrieved by the temporary decided line retrieving device 25.

In step B1 of FIG. 5, the retrieval of an unestablished gate is executed. The unestablished gate of the NAND gate means a state where an output logical value is not "1", and an input logical value is not "0". When such a gate is retrieved by the unestablished gate retrieving device 251, then NAND gates G22 and G23 are detected in FIG. 18. However, as it is G23 that has a failure propagation path as an output terminal, G23 is detected as an unestablished gate.

Since the unestablished gate is detected in step B1, the detection is determined in the step B2, and the process proceeds to step B3.

In step B3, in the temporary decided candidate retrieving device 252, an input signal line, a logical state thereof having yet to be unestablished, in the unestablished gate is retrieved.

Neither of the signal lines (L16, and L19) of G23 have been unestablished yet for logical states. In this case, L16 is set as a temporary decided candidate.

Then, in step B4 of FIG. 5, by the temporary decided input terminal retrieving device 253, a signal line, a logical state thereof having yet to be unestablished, is traced in an input direction from the temporary decided candidate until the tracing reaches at the input terminal of the target gate.

By tracing the L16 in the input direction, L2, L3 and L6 are obtained as input terminals. In this case, L2 is set as a temporary decided line.

Since the temporary decided line L2 is detected, conditional branch is executed in step A7 and the processing of the target gate C17 is finished.

The host a failure location evaluating device receives information indicating that the target gate C17 is an unestablished gate, and the temporary decided line is L2.

Next, consideration is given to a case where the expected value of the input/output signal of the circuit and the logical states of input/output signals (L2=0, L22=1, and L23=1) have been provided as an initial state.

It is assumed that as a failure terminal information, (F1, and F2) have been associated with the failure output terminal L23.

First, in the initialization device 21, the circuitry of the target gate C17 is taken out by referring to the logic circuitry storage unit 41, and the circuit composed of the basic gates (FIG. 18) is obtained.

The logical states of the input/output terminal and the signal line are initialized (step A1 in FIG. 4).

Then, in the input/output state setting device 22, logical and expected values of the input/output terminal of the target gate C17 are set.

The following are then set: L1=X[1], L2=0[1], L3=X[1], L6=X[1], L7=X[1], L22=1[1], and L23=1[0]. Each bracketed numeral denotes an expected value.

In addition, as related failure terminals, (F1, and F2) are set at L23 (step A2 in FIG. 4).

In step A3 of FIG. 4, by the expected value setting device 23, an expected value inside the logic circuit of the target gate is obtained by executing an IF-THEN operation in an output direction.

The IF-THEN operation in the output direction is carried out by referring to the expected values of the input terminals (L1, L2, L3, L6 and L7), and the rule of the IF-THEN operation for the NAND gate serving as the basic gate (see FIG. 20).

Then, in step A4 of FIG. 4, by the logical state setting device 24, the expected value of the signal line inside the logic circuit is obtained. L16=1 is implied by the IF-THEN operation for G16.

Thereafter, the following are implied: L10=0 at G22, L1=1 and L3=1 at G10, L19=0 at G23, L7=1 and L11=1 at G19, and L6=0 at G11, and logical values are then obtained for all the signal line of the target gate C17.

Since no logical contradiction has occurred, the process moves to step A6 in FIG. 4 (step A5).

Subsequently, in step A6 of FIG. 4, a temporary decided line is retrieved by the temporary decided line retrieving device 25.

In step B1 of FIG. 5, an unestablished gate is retrieved. Since the logical values of all the signal lines of the target gate have been established, there are no unestablished gates.

Since no unestablished gates are detected in step B1, no detection is determined in step B2 and the temporary decided line retrieval (step A6 in FIG. 4) is finished.

Then, since no temporary decided lines have been retrieved, the process proceeds to step A8 of FIG. 4 (step A7).

In step A8 of FIG. 4, by the related failure terminal setting device 26, a related failure terminal in the input/output terminal of the target gate is obtained.

In step C1 of FIG. 6, by the failure output terminal retrieving device 261, a failure output terminal, in which logical and expected values differ from each other in the output terminal of the target gate, is retrieved and L23=1[0] is obtained.

Since the failure output terminal is detected in step C1, the detection is determined in step C2, and the process proceeds to step C3.

In step C3, by the failure propagation path tracing device 262, the failure propagation path is traced in an input direction from the starting point which is the failure output terminal L23 until the tracing reaches at the input terminal of the target gate.

In this case, L23=1[0], L19=0[1], L11=1[0], and L6=0[1] can be traced.

In step C4 of FIG. 6, the related failure gate terminal setting device 263 adds information regarding related failure terminals (F1, and F2) to the failure input terminal L6 in the input side. Note that the related failure terminals have been set in the failure output terminal L23 in the output side of the failure propagation path traced in step C3.

The host a failure location evaluating system obtains the logical values of newly implied signal lines (L1=1[1], L3=1 [1], L6=0[1], and L7=1[1]), and (F1, and F2) as information regarding the related failure terminals of L6.

Figure 21:
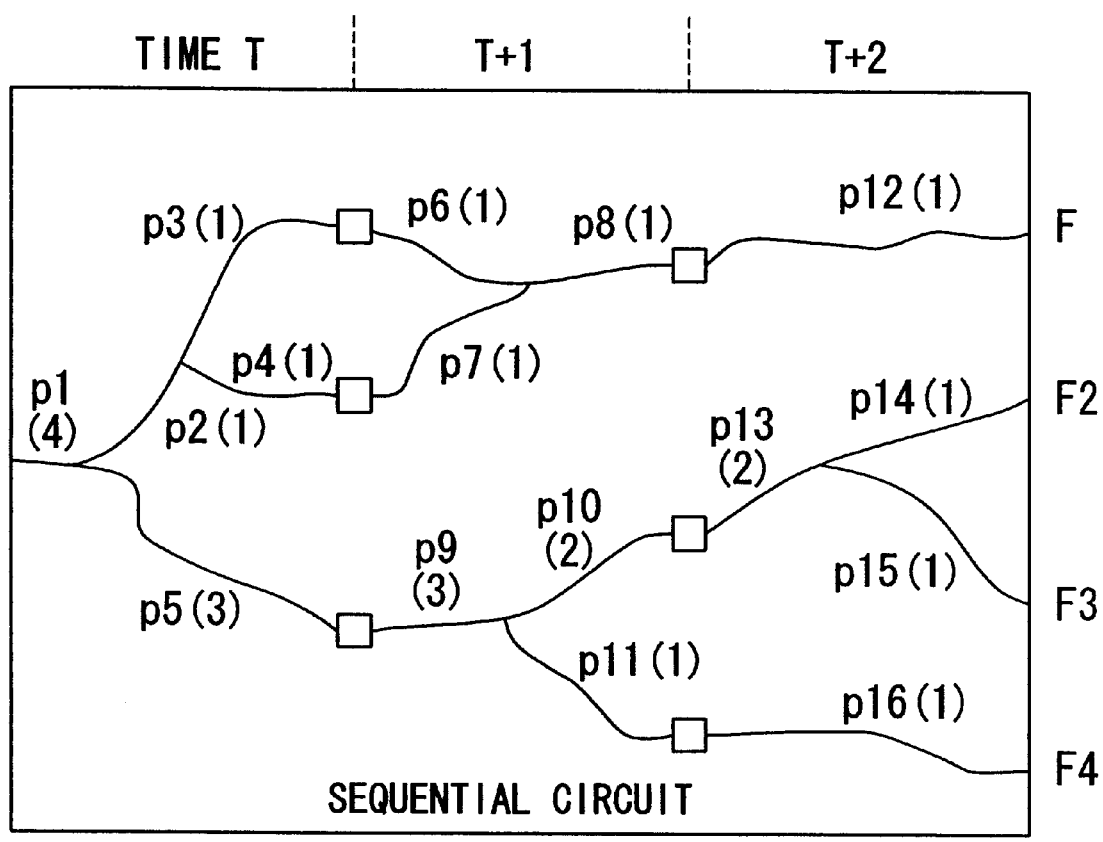
FIG. 21 is a view illustrating a conventional technology.

By superposing information regarding all the gates on one another, it is possible to obtain the failure propagation paths and a weight of each path for the entire logic circuit as shown in FIG. 21.

[Second Embodiment of the Invention]

Figure 7:
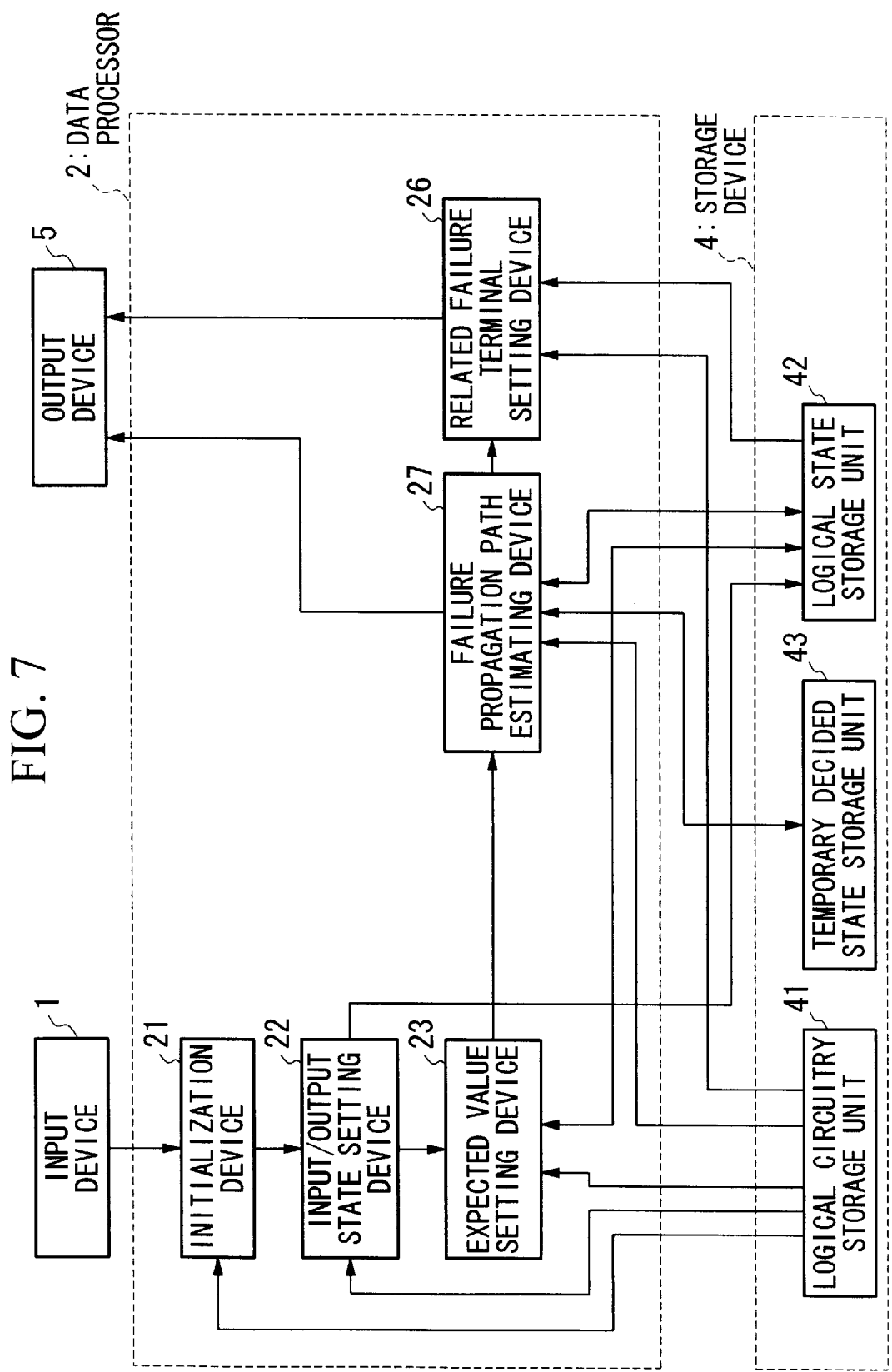
FIG. 7 is a constitutional view of a second embodiment of the present invention.

Next, a second embodiment of the present invention will be described in detail with reference to the accompanying drawings. FIG. 7 illustrates the constitution of the second embodiment of the present invention. As shown in FIG. 7, according to the second embodiment of the invention, the data processor 2 is constituted in such a manner that a failure propagation path evaluating device 27 is provided instead of the logical state setting device 24 of the data processor 2 shown in FIG. 1, and that the temporary decided line retrieving device 25 of the data processor 2 shown in FIG. 1 has been omitted. In addition, a temporary decided state storage unit 43 is added to the storage device 4.

The temporary decided state storage unit 43 stores a temporary decided level indicating the number of times a temporary decision is made, and a temporary decided level at the point of time when the logical state of each signal line is evaluated by an IF-THEN operation.

The failure propagation path evaluating device 27 can use a failure propagation path evaluating system described in the foregoing publication of Patent Laid-Open Hei 11 (1999)-153646. Specifically, the temporary decided level stored in the temporary decided state storage unit 43 and the logical state inside the target gate stored in the logical state storage unit 42 are updated by referring to the circuitry of the target gate recorded in the logic circuitry storage unit 41, and the logical state of the input/output terminal recorded in the logical state storage unit 42. Then, all failure propagation paths are obtained, which satisfy the logical state of the input/output terminal given as an initial value.

Now, the operation of the second embodiment of the present invention will be described with reference to the accompanying drawings. Initialization device 21, input/output state setting device 22, expected value setting device 23, and related failure terminal setting device 26 in the second embodiment of the present invention are similar to the respective devices 21, 22, 23 and 26 in the first embodiment, and thus the description thereof will be omitted. The operations of the initialization device 21, the input/output state setting device 22, the expected value setting device 23 and the related failure terminal setting device 26 of steps A1 to A3, and A8 of FIG. 8, which is a flowchart showing the operation of the second embodiment of the invention, are identical to those of the first embodiment, executed in steps A1 to A3, and A8 of FIG. 4. Hereinbelow, descriptions of the operations identical those of the first embodiment are omitted, and descriptions are rather focused on different points.

Figure 8:
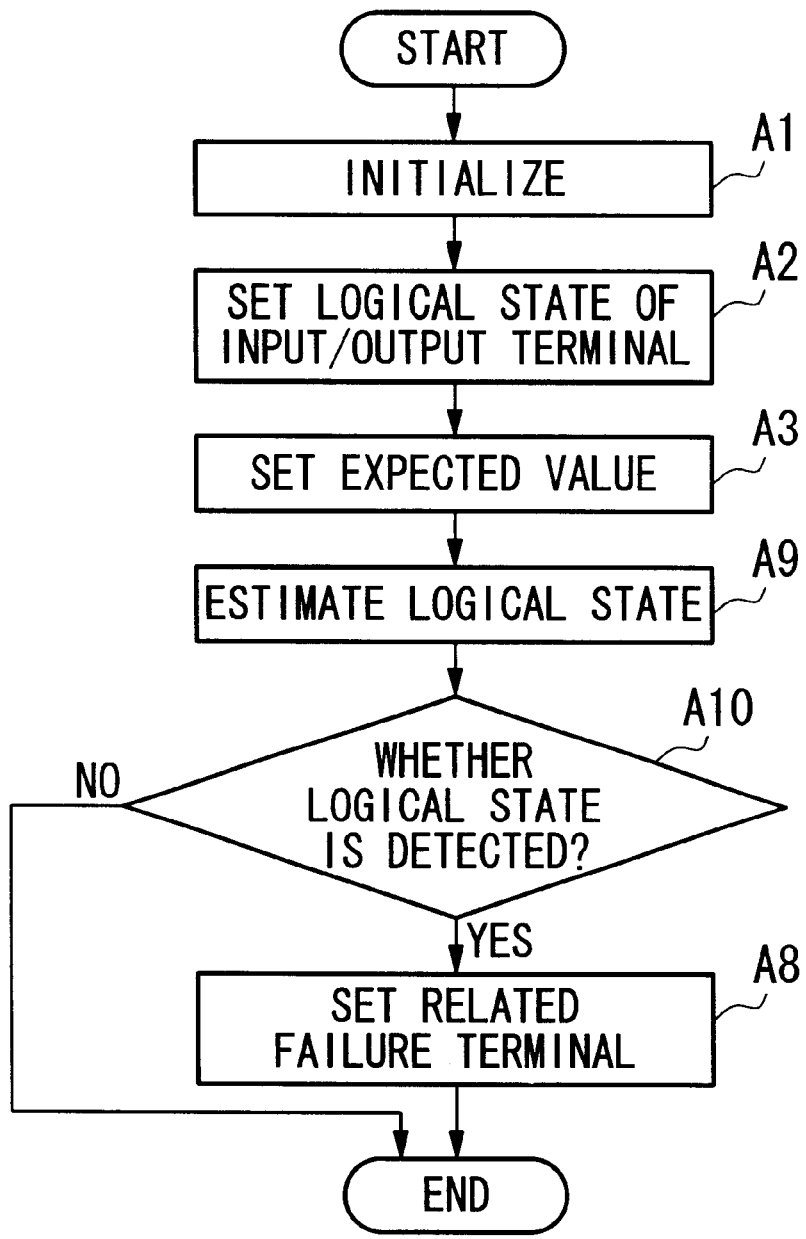
FIG. 8 is a flowchart showing an operation of the second embodiment of the present invention.

In step A9 of FIG. 8, the failure propagation path evaluating device 27 updates the temporary decided level stored in the temporary decided state storage unit 43, and the logical state inside the target gate stored in the logical state storage unit 42, by referring to the circuitry of the target gate recorded in the logic circuitry storage unit 41, and the logical state of the input/output terminal recorded in the logical state storage unit 42. Then, the failure propagation path evaluating device 27 obtains all failure propagation paths, which satisfy the logical state of the input/output terminal given as an initial value.

In this case, conditional branch is executed depending on whether the logical state and the failure propagation path are detected. If detected, the process moves to step A8. If not detected, the process is finished (step A10).

In step A8 of FIG. 8, the related failure terminal setting device 26 sets a related failure terminal for each of the failure propagation paths obtained in step A7.

Then, the host a failure location evaluating system obtains information regarding all the combinations of the logical states of the input/output terminals of the target gate, and the related failure terminal corresponding to each logical state. This means that while the number of temporary decided signal lines obtained by the host a failure evaluating system is one according to the first embodiment of the present invention, a plurality of signal lines are temporarily decided simultaneously according to the second embodiment of the present invention.

As can be understood from the foregoing, by using the hierarchically defined circuitry composed of the basic gates, it is possible to process the target gate during the evaluation of the location of a failure.

It is also possible to treat the gate as a basic gate in another hierarchically defined gate.

EXAMPLE 2

Next, in order that the foregoing second embodiment of the present invention is described in more detail, an example of the operation thereof will be specifically described in detail with reference to FIGS. 7, 3, 8, 6 and 18. A specific example described hereinbelow is the application of the invention to a case where the gate C17 of the circuit of FIG. 18 is included in a logic circuit targeted by the failure location evaluating device.

Consideration is given to the case of performing an IF-THEN operation for the input/output terminal of the target gate C17, retrieving an unestablished gate and a temporary decided line, and setting a related failure terminal during the evaluation of the location of a failure. In this case, the logical states of signal lines are represented by four values of "0", "1", "U (Unknown)", and X (Don't Care)". However, it should be understood that the present invention is not limited to such four values, and it is applicable when logical states are represented in different manners.

Now, consideration is given to a case that as an initial state, the expected value of the input/output signal of the target gate and the logical state of output signals (L22=1, and L23=1) have been provided.

First, by the initialization device 21, the circuitry of the target gate C17 is taken out by referring to the logic circuitry storage unit 41, and then a circuit composed of basic gates (see FIG. 18) is obtained.

Then, the logical states of the input/output terminal and the signal line are initialized (step A1 in FIG. 8).

Then, by the input/output state setting device 22, logical and expected values are set for the input/output terminal of the target gate C17.

The followings are then set, i.e., L1=X[1], L2=X[1], L3=X[1], L6=X[1], L7=X[1], L22=1[1], and L23=1[0]. Each bracketed numeral denotes an expected value (step A2 in FIG. 8).

In step A3, by the expected value setting device 23, an expected value inside the logic circuit of the target gate is obtained by executing an IF-THEN operation in an output direction.

The IF-THEN operation in the output direction is carried out by referring to the expected values of the input terminals (L1, L2, L3, L6 and L7) and the rule of the IF-THEN operation of the NAND gate serving as a basic gate, and then expected values are obtained for all the signal lines inside the target gate.

Figure 19:
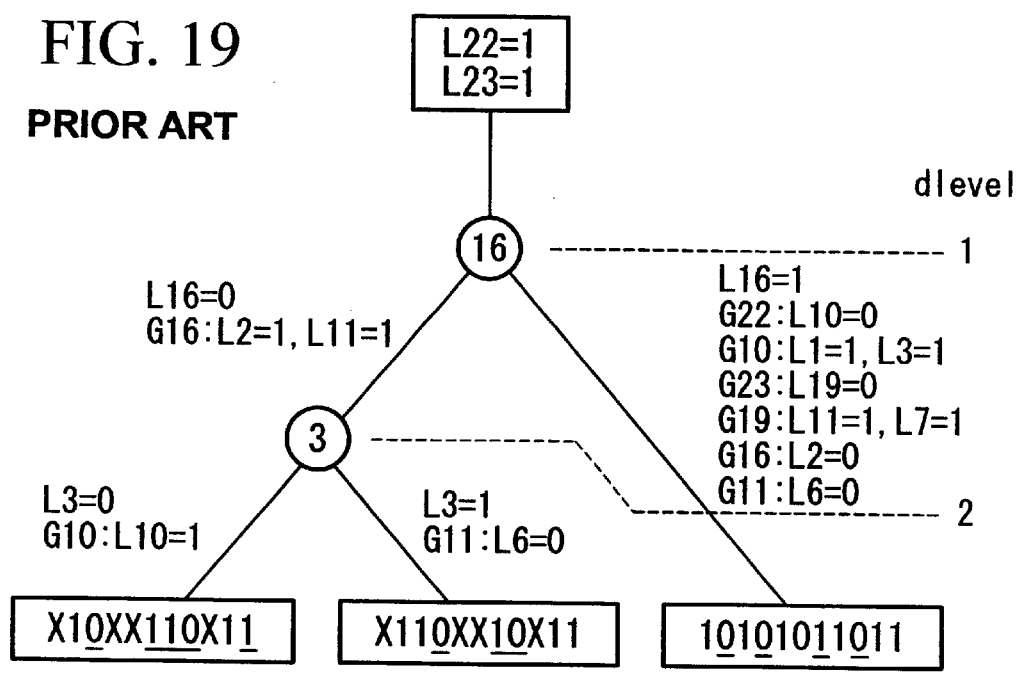
FIG. 19 is a view illustrating a conventional technology.

Then, in step A9 of FIG. 8, evaluation is made as to all failure propagation paths, which satisfy the logical states (L22=1[1], and L23=1[0]) of the input/output terminal given as initial values. For example, by using the failure propagation path evaluating system disclosed in the publication of Japanese Patent Laid-Open Hei 11 (1999)-153646, as illustrated by the decision tree of FIG. 19, logical values are temporarily set on the signal lines of two places, and the following three logical states are obtained, i.e., (L1, L2, L3, L6, L7, L10, L11, L16, L19, L22, and L23)= (X10XX110X11), (X110XX10X11), and (10101011011). Then, by comparing each of the obtained logical states with the expected value obtained in step A3 of FIG. 8, a failure propagation path is obtained.

Since the logical states satisfying the logical states of the input/output terminal given as initial values have been obtained, the process proceeds to step A8 (step A7 of FIG. 8).

In step A8 of FIG. 8, by the related failure terminal setting device 26, related failure terminals in the input/output terminal of the target gate are obtained for all the logical states obtained in step A7.

First, the related failure terminals are obtained with respect to the following: (L1=X[1], L2=1[1], L3=0[1], L6=X[1], L7=X[1], L10=1[0], L11=1[0], L16=0[1], L19=X[1], L22=1[1], and L23=1[0]).

In step C1 of FIG. 6, by the failure output terminal retrieving device 261, a failure output terminal, in which logical and expected values differ from each other in the output terminal of the target gate, is retrieved and L23=1[0] is obtained.

After the detection of the failure output terminal in step C1, the detection is determined in step C2, and the process moves to step C3.

In step C3, by the failure propagation tracing device 262, the failure propagation path is traced in an input direction from the starting point which is the failure output terminal L23 until the tracing reaches at the input terminal of the target gate.

In this case, L23=1[0], L16=0[1], L11=1[0], and L3=0[1] can be traced.

In step C4, the related failure gate terminal setting device 263 adds information regarding related failure terminals (F1, and F2) to the failure input terminal L3 in the input side. Note that the related failure terminals have been set in the failure output terminal L23 in the output side of the failure propagation path traced in step C3.

If similar processing is performed for the remaining two logical states, in the case of (X110XYX10X11), (L1=X[1], L2=1[1], L3=1[1], L6=0[1], L7=X[1], L10=X[0], L11=1[0], L16=0[1], L19=X[1], L22=1[1], and L23=1[0]) can be traced in the manner of L23=1[0], L16=0[1], Lll=1[0], and L6=0[1]. Accordingly, the information of the related failure terminals (F1 and F2) set in the failure output terminal L23 in the output side is added to the failure input terminal L6 in the input side.

In addition, with respect to (10101011011), (L1=1[1], L2=0[1], L3=1[1], L6=0[1], L7=1[1], L10=0[0], L11=1[0], L16=1[1], L19=0[1], L22=1[1], and L23=1[0]) can be traced in the manner of L23=1[0], L19=0[1], L11=1[0], and L6=0 [1]. Accordingly, the information of the related failure terminals (F1 and F2) set in the failure output terminal L23 in the output side is added to the failure input terminal L6 in the input side.

The host a failure location evaluating system obtains three combinations of the logical values (L2=1, and L3=0), (L2=1, L3=1, and L6=0), and (L1=1, L2=0, l3=1, L6=0, and L7=1) of newly implicated input/output signal lines, and L3 (F1, and F2), L6 (F1, and F2), and L6 (F1, and F2) as information on related failure terminals with respect to each logical state.

The host a failure location evaluating system can proceed with the evaluation of the location of a failure by setting temporary logical values, that is, three combinations of (L2=1, and L3=0), (L2=1, L3=1, and L6=0), and (L1=1, L2=0, L3=1, L6=0, and L7=1) with respect to the signal line connected to the input/output terminal of the target gate.

[Third Embodiment of the Invention]

Next, a third embodiment of the present invention will be described in detail with reference to the accompanying drawings. The third embodiment of the present invention is directed to a case that a target gate has circuitry including a failure propagation path extending over a plurality of time points inside the target gate as in the case of a flip-flop (FF).

Figure 9:
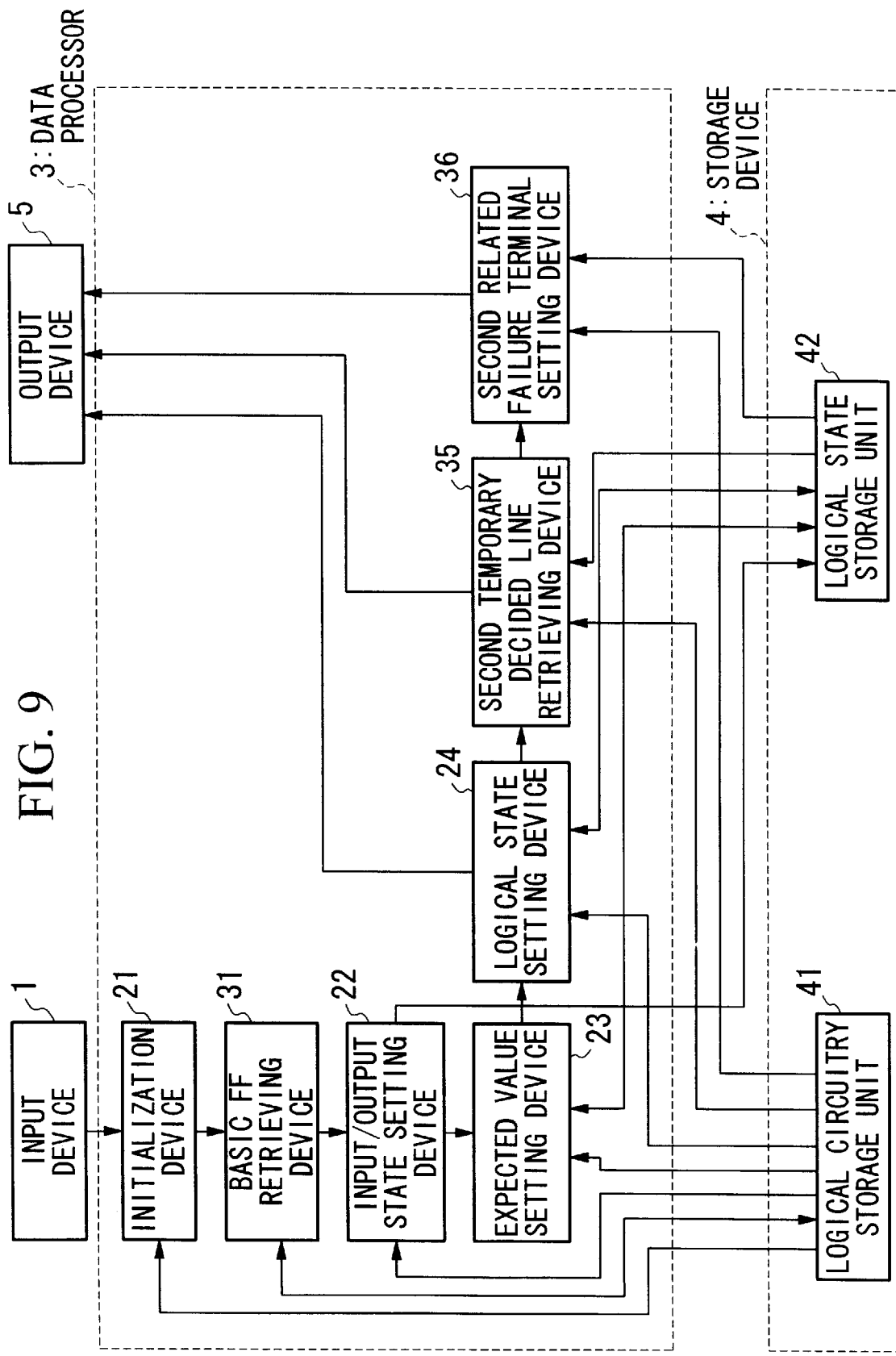
FIG. 9 is a constitutional view of a third embodiment of the present invention.

FIG. 9 illustrates the constitution of the third embodiment of the present invention. As shown in FIG. 9, according to the third embodiment of the invention, a data processor 3 includes: second temporary decided line retrieving device 35 provided instead of the temporary decided line retrieving device 25 in the constitution of the data processor 2 of the first embodiment shown in FIG. 1; second related failure terminal setting device 36 provided instead of the related failure terminal setting device 26; and basic FF retrieving device 31 provided additionally.

In addition, according to the third embodiment of the present invention, the data processor 3 is different from the data processor 2 of the first embodiment in that it can process a logical state extending over a plurality of time points.

In FIG. 9, the initialization setting device 21 selects a logic circuitry based on the kind of a target gate entered from the input device 1 by referring to the logic circuitry storage unit 41, and then performs initialization.

The basic FF retrieving device 31 retrieves the basic FF of the circuit of the target gate by referring to the logic circuitry storage unit 41, and then stores the position of the basic FF inside the circuit in the logic circuitry storage unit 41.

The input/output state setting device 22 sets expected and logical values of two time points in the input/output terminal of the target gate, and information regarding a related failure terminal, which are provided from the input device 1, in the input/output terminal of the circuitry, and then stores them in the logical state storage unit 42.

The expected value setting device 23 calculates expected values at two time points inside the target gate composed of the basic gate by referring to the expected values of the input/output terminal at two points, which are set by the input/output state setting device 22 and are recorded in the logical state storage unit 42, and the logic circuitry storage unit 41, and then records the same in the logical state storage unit 42.

The calculation of the expected value is carried out by executing an IF-THEN operation in an output direction for obtaining an output state in accordance with an input state. The IF-THEN operation in the basic FF is extending over two time points.

Figure 15:
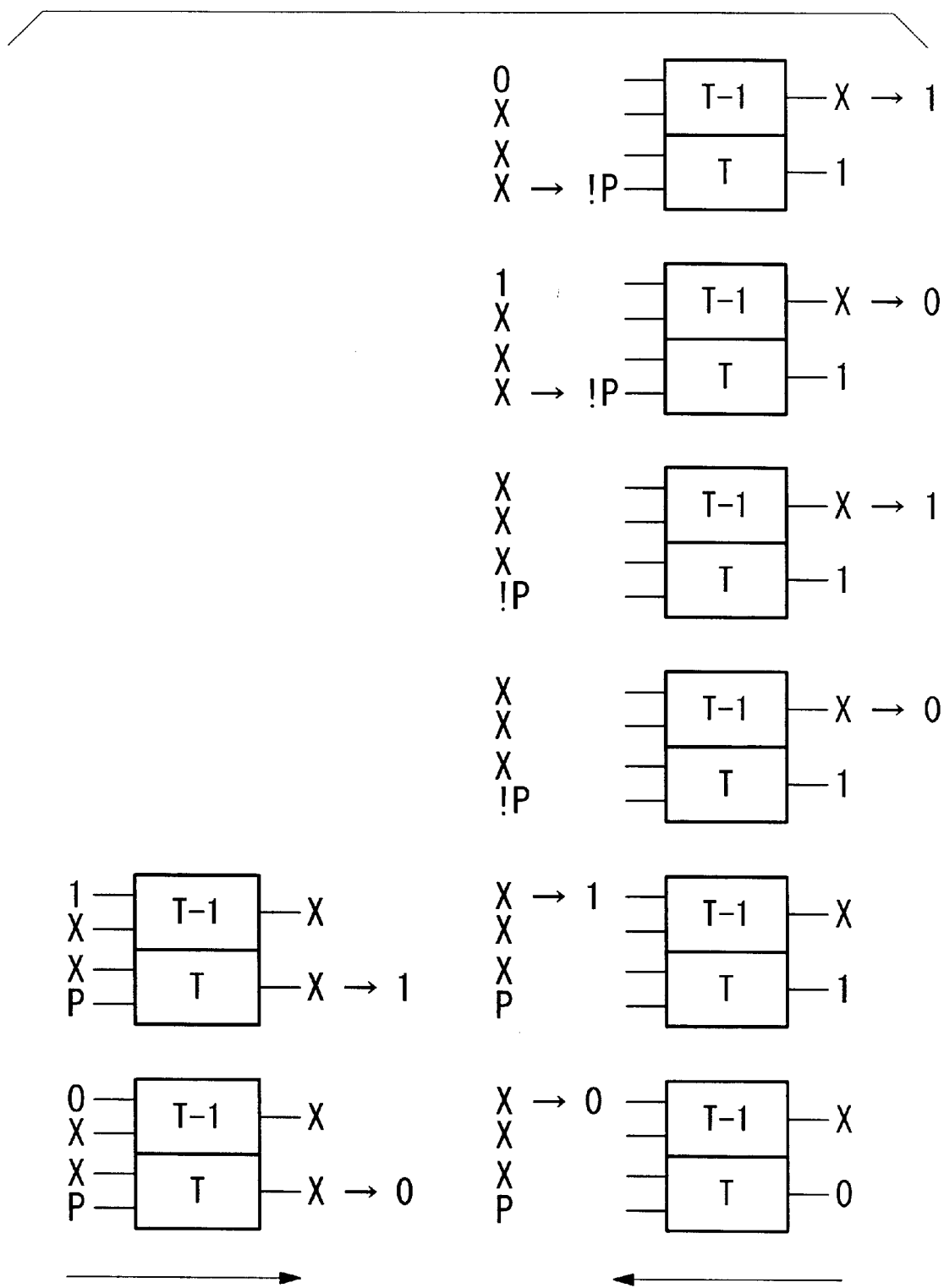
FIG. 15 is a view illustrating the third embodiment of the present invention.

FIG. 15 illustrates an IF-THEN operation carried out for a D-type flip-flop (DFF) extending over two time points (T–1, and T).

The logical state setting device 24 calculates logical states at two time points inside the target gate composed of the basic gate by referring to the logical value of the input/output terminal, which is set by the input/output state setting device 22 and is recorded in the logical state storage unit 42, and the logic circuitry storage unit 41, and then records the obtained logical states in the logical state storage unit 42. The calculation of the logical state is carried out by executing an IF-THEN operation in an input/output direction.

As in the case of the expected value, the IF-THEN operation for the basic FF is extending over two time points. If necessary, the obtained logical value of the input/output terminal is output to the output device 5. If logical contradiction is detected during the evaluation, then the processing is finished.

The second temporary decided line retrieving device 35 retrieves an input terminal, a temporary logical value being set thereon, by referring to the circuitry of the target gate recorded in the logic circuitry storage unit 41, the expected values and the logical states of two time points inside the target gate recorded in the logical state storage unit 42. The obtained input terminal, a temporary logical value being set thereon, is output to the output device 5, then the processing is finished. If no temporary decided lines are discovered, then the process moves to the second related failure terminal setting device 36.

The second related failure terminal setting device 36 obtains a related failure terminal in the input/output terminal of the target gate by referring to the circuitry of the target gate recorded in the logic circuitry storage unit 41, and the expected value and the logical state of two time points inside the target gate recorded in the logical state storage unit 42. Information of the obtained related failure terminal is output to the output device 5, and then the processing is finished.

Figure 10:
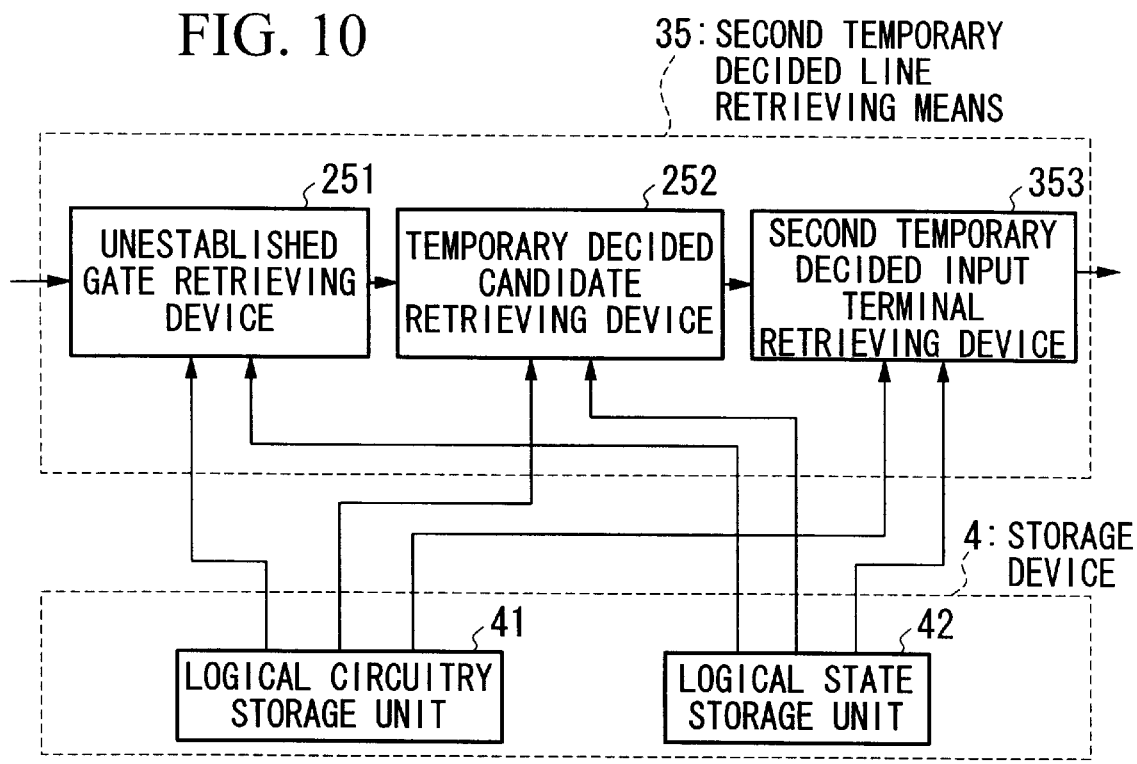
FIG. 10 is a constitutional view of the third embodiment of the present invention.

Next, the constitution of the second temporary decided line retrieving device 35 of the third embodiment of the present invention will be described in detail by referring to FIG. 10. As shown in FIG. 10, the second temporary decided line retrieving device 35 includes: unestablished gate retrieving device 251; temporary decided candidate retrieving device 252; and second temporary decided input terminal retrieving device 353.

The unestablished gate retrieving device 251 retrieves an unestablished gate having an output terminal connected to a failure propagation path by referring to the circuitry and the rule of an IF-THEN operation for the basic gate recorded in the logic circuitry storage unit 41, and the logical value of each signal line inside the target gate stored in the logical state storage unit 42. However, this unestablished gate retrieving device 251 differs from its equivalent of the first embodiment in that an unestablished gate is retrieved with respect to logical states of two time points.

The temporary decided candidate retrieving device 252 retrieves an input terminal, a logical state thereof having yet to be unestablished, as a temporary decided candidate in the unestablished gate retrieved by the unestablished gate retrieving device 251 by referring to the logic circuitry storage unit 41 and the logical state storage unit 42.

The second temporary decided input terminal retrieving device 353 traces a signal line, a logical state thereof having yet to be unestablished, in an input direction from the input terminal of the unestablished gate serving as a temporary decided candidate until the tracing reaches at the input terminal of the target gate, in the circuit of the target gate, by referring to the logic circuitry storage unit 41 and the logical state storage unit 42, and then one of such reached input terminals of the target gate is set as a temporary decided terminal.

At this time, when the tracing encounters the output terminal of the basic FF during the tracing, determination is made as to whether the process goes back in time based on the clock signal of the basic FF, or the tracing is finished, by referring to the position of the basic FF retrieved by the basic FF retrieving device 31, and recorded in the logic circuitry storage unit 41.

Figure 11:
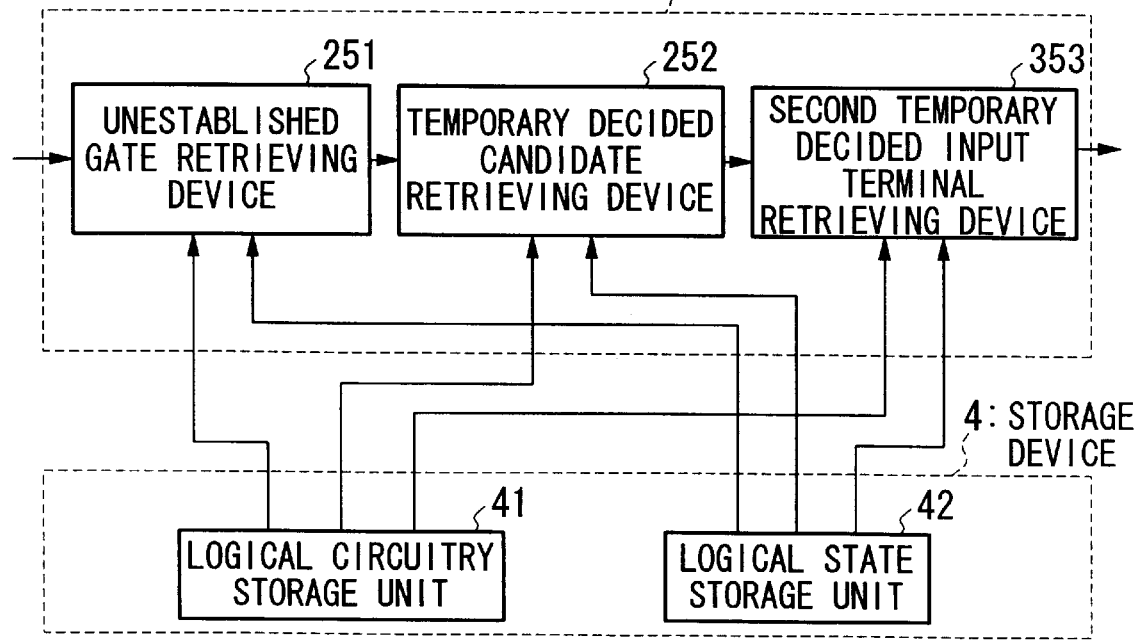
FIG. 11 is a constitutional view of the third embodiment of the present invention.

Next, by referring to FIG. 11, the constitution of the related failure terminal setting device 36 of the third embodiment of the present invention will be described in detail. In FIG. 11, the related failure terminal setting device 36 includes: a failure output terminal retrieving device 261; second failure propagation path tracing device 362; and related failure gate terminal setting device 263.

The failure output terminal retrieving device 261 retrieves a failure output terminal, in which logical and expected values differ from each other in the output terminal of the target gate, by referring to the circuitry recorded in the logic circuitry storage unit 41, and the logical and expected values of the target gate stored in the logical state storage unit 42.

The second failure propagation path tracing device 362 traces a failure propagation path in an input direction until the tracing reaches at the input terminal of the target gate, from the starting point which is the failure output terminals of two time points retrieved by the failure output terminal retrieving device 261, by referring to the logic circuitry storage unit 41 and logical state storage unit 42.

At this time, when the tracing encounters at the output terminal of the basic FF during the tracing, determination is made as to whether the process goes back in time based on the clock signal of the basic FF, or the tracing is finished, by referring to the position of the basic FF, which is retrieved by the basic FF retrieving device 31 and is recorded in the logic circuitry storage unit 41.

The related failure gate terminal setting device 263 adds information regarding a related failure terminal to a failure input terminal in the input side by referring to the logic circuitry storage unit 41 and logical state storage unit 42. Note that the related failure terminal has been set in the output side of the failure propagation path traced by the second failure propagation path tracing device 363.

Next, the operation of the third embodiment of the present invention will be described by referring to FIGS. 9 to 14.

Figure 12:
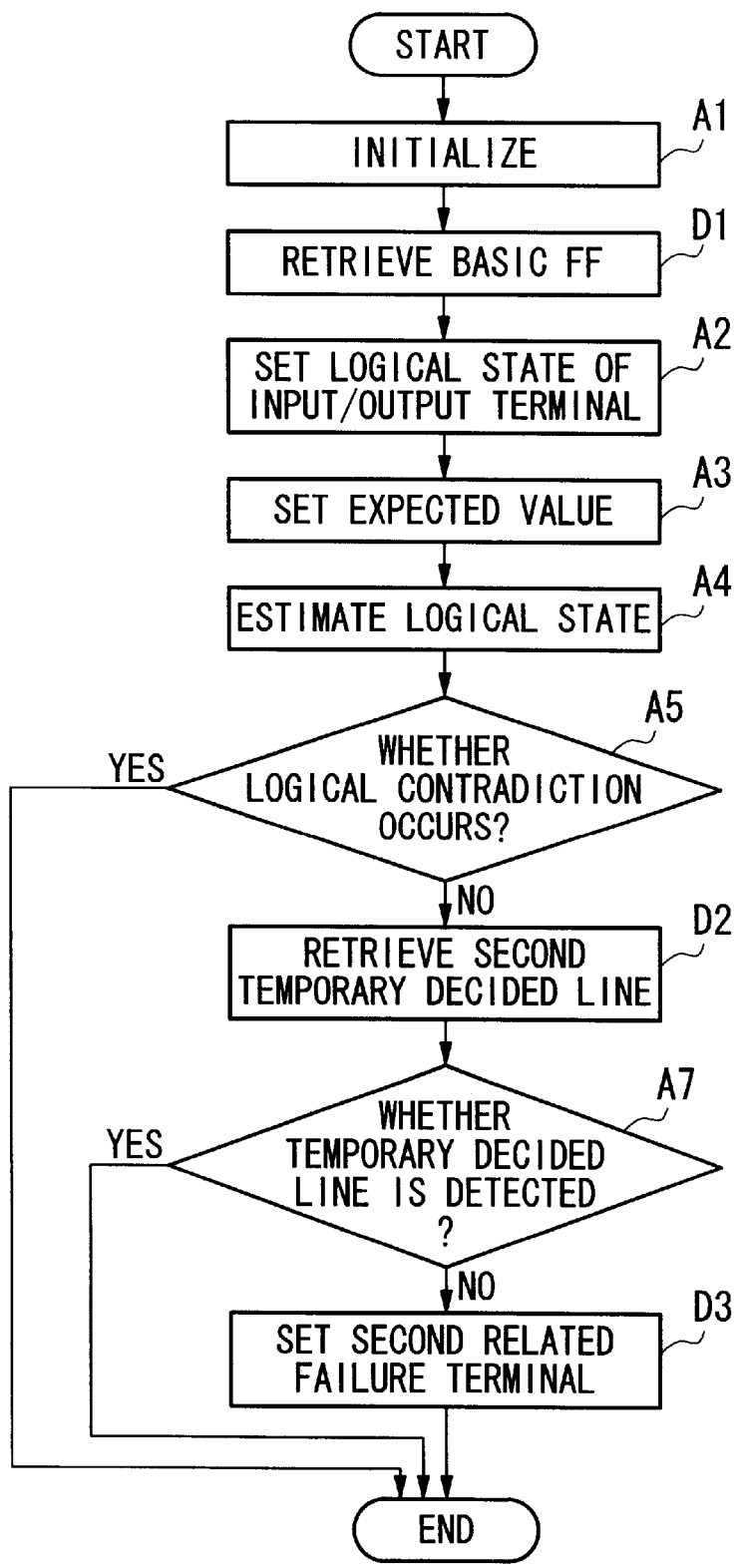
FIG. 12 is a flowchart showing an operation of the third embodiment of the present invention.

In the initialization device 21, the logic circuitry of the target gate recorded in the logic circuitry storage unit 41 is selected based on information regarding the kind of the target gate provided from the input device 1, and initialization is performed (step A1 in FIG. 12).

In step D1 of FIG. 12, the basic FF retrieving device 31 retrieves the basic FF of the circuit of the target gate by referring to the logic circuitry storage unit 41, and records the position of the basic FF inside the circuit in the logic circuitry storage unit 41 (step D1). The information recorded herein is referred to in second temporary decided line retrieving processing (step D2) and second related failure terminal setting processing (step D3).

Subsequently, in the input state setting device 22, the logical and expected values of the input/output signal and the information of the related failure terminal, which are provided from the input device 1, are set in the input/output terminal of the logic circuitry selected by the initialization device 21, and recorded in the logical state storage unit 42 (step A2). However, unlike the case of the first embodiment, logical states of two time points are set.

Then, in the expected value setting device 23, an expected value inside the logic circuit of the target gate is obtained by executing an IF-THEN operation in an output direction (step A3 in FIG. 12).

The IF-THEN operation for the basic FF is extended over two time points. For example, in the case of the DFF, logical values of an input/output line are obtained according to the rule of the IF-THEN operation over two time points (T−1, and T).

Then, in the logical state evaluating device 24, a logical state inside the logic circuit of the target gate is obtained by executing an IF-THEN operation in an input/output direction.

By comparing the obtained logical state with the expected value obtained in step A3 of FIG. 12, a failure propagation path inside the target gate can be obtained (step A4).

In the case where logical contradiction occurs during the processing, the process is finished (step A5).

In the case that no logical contradiction occurs in step A4 of FIG. 12, in the second temporary decided line retrieving device 35, the input terminal of the target gate, a temporary logical value being set thereon, is retrieved by referring to the circuitry of the target gate and the position of the basic FF recorded in the logic circuitry storage unit 41, the logical state inside the target gate recorded in the logical state storage unit 42, and the expected value of each node inside the target gate (step D2).

In the case where a temporary decided line is detected, the obtained input terminal, a temporary logical value being set thereon, and the time are output to the output device 5, and the process is finished (step A7). At this time, in the case where the input terminal of the target gate, a temporary logical value being set thereon, is detected, it means that the target gate is an unestablished gate. On the other hand, in the case where the input terminal is not detected, then it means that the target gate is an established gate, making it unnecessary to set a temporary logical value.

When in step D2 of FIG. 12, no temporary, decided lines are detected and it is determined that the target gate is an established gate, in the second related failure terminal setting device 36, a related failure terminal in the input/output terminal of the target gate is obtained by referring to the circuitry of the target gate recorded in the logic circuitry storage unit 41, and the expected value and the logical state inside the target gate recorded in the logical state storage unit 42. The information of the obtained related failure terminal is output to the output device 5, and then the process is finished (step A8).

Now, the second temporary decided line retrieval in step D2 will be described in detail by referring to FIGS. 10 and 13.

First, in step B1, an unestablished gate having an output terminal connected to the failure propagation path at two time points is retrieved by referring to the circuitry and the rule of the IF-THEN operation of the basic gate recorded in the logic circuitry storage unit 41, and the logical value of each signal line inside the target gate stored in the logical state storage unit 42.

Then, in step B2, conditional branch is executed depending on whether an unestablished gate is detected in step B1. If detected, the process moves to step B3. If not detected, the temporary decided line retrieval is finished.

Subsequently, in the temporary decided candidate retrieving device 252, an input terminal, a logical state thereof having yet to be unestablished, is retrieved as a temporary decided candidate in the unestablished gate retrieved by the unestablished gate retrieving device 251, by referring to the logic circuitry storage unit 41 and logical state storage unit 42 (step B3).

Figure 13:
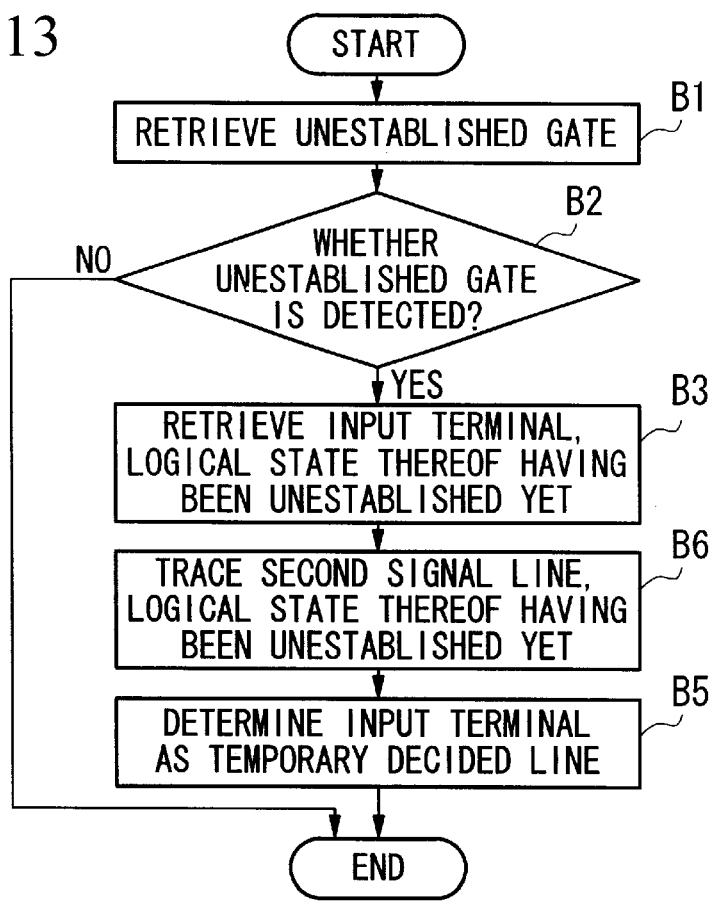
FIG. 13 is a flowchart showing an operation of the third embodiment of the present invention.

The temporary decided input terminal retrieving device 353 traces a signal line, a logical state thereof having yet to be unestablished, in an input direction from the input terminal of the unestablished gate obtained as a temporary decided candidate in step B3 of FIG. 13, until the tracing reaches at the input terminal of the target gate, by referring to the logic circuitry storage unit 41 and logical state storage unit 42. Then, one of such reached input terminals of the target gate is set as a temporary decided terminal.

In the host a failure location evaluating device, a temporary logical value is set on the signal line serving as a temporary decided line, which is connected to the obtained temporary decided terminal.

At this time, when the tracing encounters the output terminal of the basic FF during the tracing, determination is made as to whether the process goes back in time based on the clock signal of the basic FF, or the tracing is finished, by referring to the position of the basic FF retrieved by the basic FF retrieving device 31 and recorded in the logic circuitry storage unit 41 (step B6).

Now, related failure terminal setting in step A6 will be described in detail by referring to FIGS. 10 and 14.

Figure 14:
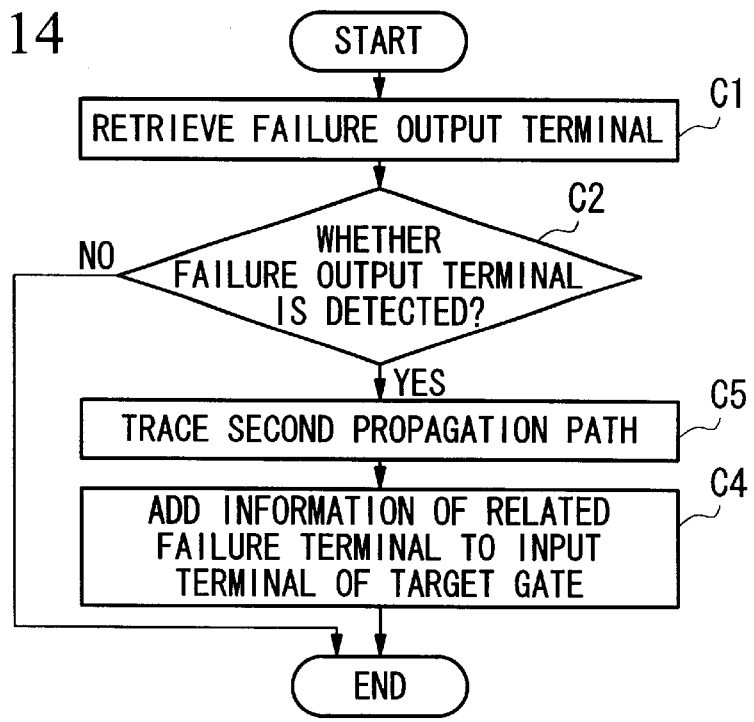
FIG. 14 is a flowchart showing an operation of the third embodiment of the present invention.

First, the failure output terminal retrieving device 261 retrieves a failure output terminal, in which logical and expected values are different from each other in the output terminal of the target gate, by referring to the circuitry recorded in the logic circuitry storage unit 41, and the logical and expected values of the target gate stored in the logical state storage unit 42, (step C1 in FIG. 14).

Then, in step C2, conditional branch is executed depending on whether a failure output terminal is detected in step C1. If detected, the process moves to step C3. If not detected, the related failure terminal setting is finished.

In step C5 of FIG. 14, the second failure propagation tracing device 362 traces a failure propagation path in an input direction, from the starting point which is the failure output terminal retrieved by the failure output terminal retrieving device 261, until the tracing reaches at the input terminal of the target gate, by referring to the logic circuitry storage unit 41 and logical state storage unit 42. At this time, when the tracing encounters the output terminal of the basic FF during the tracing, determination is made as to whether the process goes back in time based on the clock signal of the basic FF, or the tracing is finished, by referring to the position of the basic FF retrieved by the basic FF retrieving device 31 and recorded in the logic circuitry storage unit 41.

The related failure gate terminal setting device 263 adds information regarding a related failure terminal to the failure input terminal in the input side, by referring to the logic circuitry storage unit 41 and the logical state storage unit 42. Note that the related failure terminal has been set in the failure output terminal in the output side of the failure propagation path traced by the failure propagation path tracing device 262 (step C4).

As can be understood from the foregoing, by using the hierarchically defined circuitry composed of the basic gates, it is possible to process the target gate in the evaluation of the location of a failure. Moreover, the above-described gate can be treated as a basic gate in another hierarchically defined gate.

EXAMPLE 3

Figure 16:
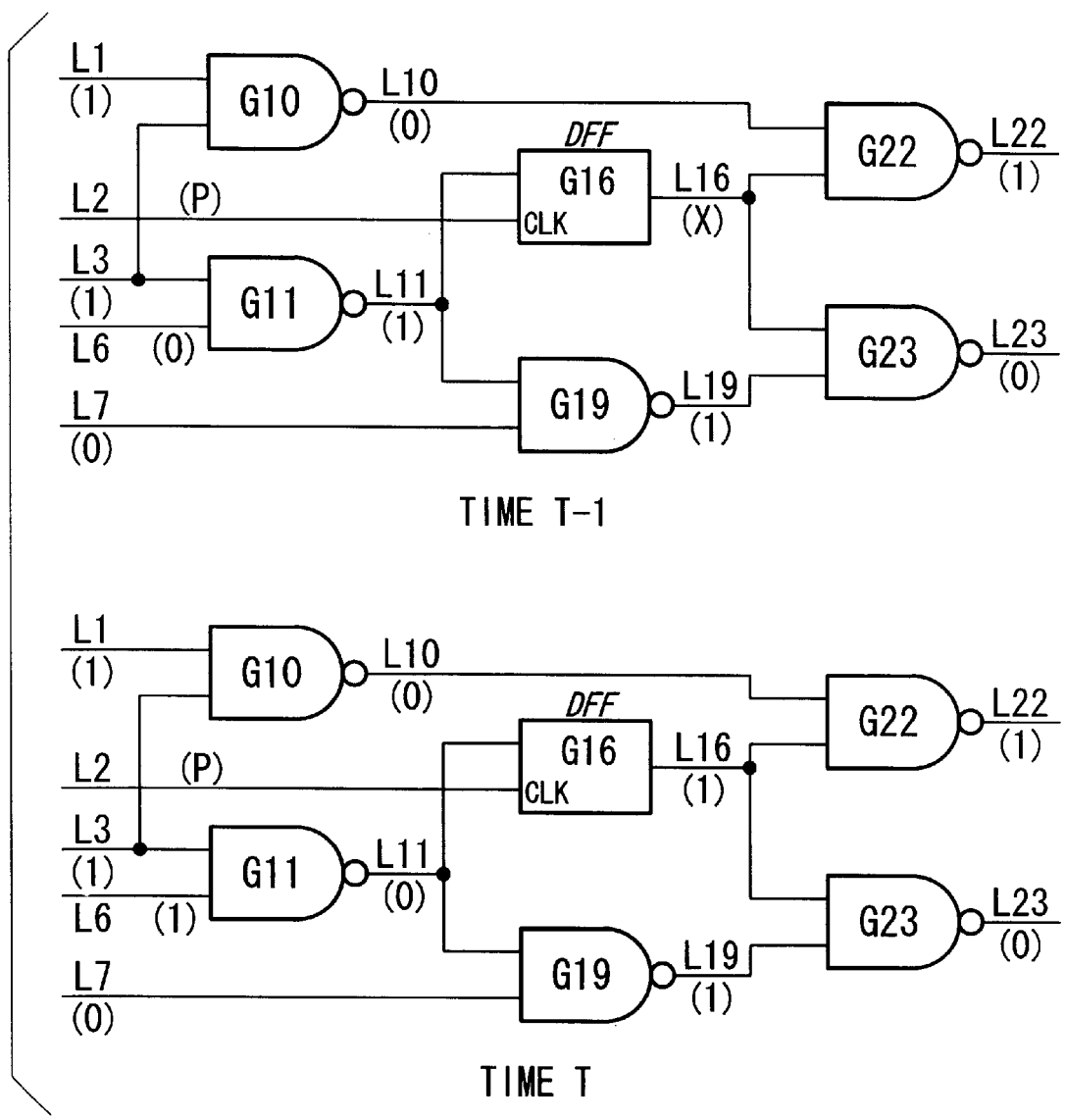
FIG. 16 is a view illustrating the embodiment of the present invention.

Next, in order that the foregoing third embodiment of the present invention is described in more detail, an example of the operation thereof will be described in detail with reference to FIGS. 9 to 14, and 16. A specific example described hereinbelow is the application of the present invention to a case where the gate F17 of the circuit of FIG. 16 is included in a logic circuit targeted by the failure location evaluating device. Consideration is given to the case of performing an IF-THEN operation in the input/output terminal of the target gate, retrieving a temporary decided line, and setting a related failure terminal during the evaluation of the location of a failure. Each parenthesized numeral denotes an expected value.

The logical states of signal lines are expressed by five values of "0", "1", "U (Unknown)", "X (Don't Care)", and "P (Pulse)". However, the present invention should not be limited to such five values, and can be applied to a case where logical states expressed in different manners are used. The logical state "P (Pulse)" is used as a logical value of a signal line operated when a change occurs in a signal like the clock signal of the FF.

It is now assumed that as an initial state, the expected value of the input/output signal of the target gate and the logical states of input/output signals (L22 (T−1)=1, L23 (T−1)=0, L2 (T)=P, L22 (T)=1, and L23 (T)=1) have been given.

First, in the initialization device, 21, the circuitry of the target gate F17 is taken out by referring to the logic circuitry storage unit 41, and then a circuit composed of basic gates and basic FFs (see FIG. 16) is obtained.

The logical states of the input/output terminal and the signal line are initialized (step A1 of FIG. 12).

In step D1, the basic FF is retrieved to obtain G16.

Then, in the input/output state setting device 22, logical and expected values of the input/output terminal of the target gate F17 are set.

The following are set: L1 (T−1)=X[1], L2 (T−1)=X[P], L3 (T−1)=X[1], L6 (T−1)=X[0], L7 (T−1)=X[0], L22 (T−1)=1[1], L23 (T−1)=0[0], L1 (T)=X[1], L2 (T)=P[P], L3 (T)=X[1], L6 (T)=X[1], L7 (T)=X[1], L22 (T)=1[1], and L23 (T)=1[0]. Time is put in each parenthesis ( ), while a numeral in each bracket [ ] denotes an expected value (step A2).

In step A3, by the expected value setting device 23, the expected value inside the logic circuit of the target gate is obtained by executing an IF-THEN operation in an output direction.

The IF-THEN operation of the output direction is carried out in an output direction by referring to the expected values of each of the input terminals (L1, L2, L3, L6 and L7) of time points T−1 and T, and the IF-THEN operation rule of a NAND gate serving as a basic gate (see FIG. 20), and the IF-THEN operation rule of a DFF serving as a basic FF (see FIG. 15).

A parenthesized value of FIG. 16 denotes an expected value obtained in the above manner. An expected value of L16 (T−1) will be obtained if the time T−2 is considered. In the described example, however, even L16 (T−1)=X causes no difficulty, because the processing is carried out at two time points T−1 and T.

Subsequently, in step A4 of FIG. 12, by the logical state setting device 24, a logical value of a signal line inside the logic circuit is obtained.

By executing an IF-THEN operation at G23 (T−1), L16 (T−1)1 and L19 (T−1)=1 are implied; similarly, L10 (T−1)=0 at G22 (T−1); and L1 (T−1)=1 and L3 (T−1)=1 at G10 (T−1).

Because no logical contradictions have occurred, the process moved to step D2 of FIG. 12 (step A5).

In step D2, by the second temporary decided line retrieving device 35, a temporary decided line is retrieved.

In step B1 of FIG. 13, an unestablished gate is retrieved. When the unestablished gate is retrieved by the unestablished gate retrieving device 251, G10 (T−1), G19 (T−1), G22 (T), and G23 (T) are detected. In this case, only G23 (T) has a failure propagation path serving as an output terminal, and therefore, G23 is detected as an unestablished gate.

Since the unestablished gate is detected in step B1, the detection is determined in step B2, and the process moves to step B3.

In step B3, by the temporary decided candidate retrieving device 252, an input signal line, a state thereof having yet to be unestablished, is retrieved in the unestablished gate.

Both input signal lines (L16 (T), and L19 (T)) of G23 have yet to be unestablished for their logical states. In this case, L16 (T) is set as a temporary decided candidate.

Then, in step B6, by the second temporary decided input terminal retrieving device 353, a signal line, a logical state thereof having yet to be unestablished, is traced in an input direction from the temporary decided candidate until the tracing reaches at the input terminal of the target gate.

L16 is connected to the output terminal of G16, which is a basic FF. Thus, by referring to a clock (CLK) signal L2 (T), L2 (T)=P is obtained. It can be understood that a clock has been entered to G16 (T).

Accordingly, when the signal line, whose a logical state having yet to be unestablished, is continuously traced by going back in time, L11 (T−1) and L6 (T−1) are traced, L6 (T−1) is obtained as an input terminal, and L6 (T−1) is then detected as a temporary decided line.

Since the temporary decided line L6 (T−1) is detected, skipping step A8, the processing of the target gate C17 is finished (step A7).

The host a failure location evaluating system then receives information including the logical values (L1 (T−1)= 1[1], and L3 (T−1)=1[1]) of the newly implicated signal lines, and the temporary decided line L6 (T−1).

It is assumed now that as an initial state, the expected value of the input/output signal of the target gate, and the logical states of input/output signals (L22 (T−1)=1, L23 (T−1)=0, L2 (T)=P, L3 (T)=1, L6 (T)=1, L22 (T)=1, and L23 (T)=1 have been given.

It is also assumed that (F1 and F2) have been related as failure terminal information to the failure output terminal L23 (T).

First, by the initialization device 21, the circuitry of the target gate F17 is taken out by referring to the logic circuitry storage unit 41, and a circuit composed of basic gates as shown in FIG. 16 is obtained. The logical states of the input/output terminal and a signal line are initialized (step A1).

In step D1, the basic FF is retrieved to obtain G16.

Then, by the input/output state setting device 22, logical and expected values are set for the input/output terminal of the target gate C17.

The following are set: L1 (T−1)=X[1], L2 (T−1)=X[P], L3 (T−1)=X[1], L6 (T−1)=X[0], L7 (T−1)=X[0], L22 (T−1)=1[1], L23 (T−1)=0[0], L1 (T)=X[1], L2 (T)=P[P], L3 (T)=1[1], L6 (T)=1[1], L7 (T)=X[1], L22 (T)=1[1], and L23 (T)=1[0].

A numeral in each bracket [ ] denotes an expected value.

Further, (F1, and F2) are set as related failure terminals in L23 (T) (step A2).

In step A3, by the expected value setting device 23, an expected value inside the logic circuit of the target gate is obtained by executing an IF-THEN operation in an output direction.

The IF-THEN operation in the output direction is carried out by the expected values of the input terminals (L1, L2, L3, L6 and L7), the IF-THEN operation rule of a NAND gate serving as a basic gate (FIG. 20), and the IF-THEN operation rule of a DFF serving as a basic FF (FIG. 15).

Then, in step A4, by the logical state setting device 24, a logical value is obtained for the signal line inside the logical state. By an IF-THEN operation at G23 (T−1), L16 (T−1)=1 and L19 (T−1)=1 are implied.

Likewise, the followings are implicated: L10 (T−1)=0 at G22 (T−1); L1 (T−1)=1, and L3 (T−1)=1 at G10 (T−1); L11 (T)=0 at G11 (T); L19(T)=1 at G19 (T); and L16 (T)=0 at G23 (T).

By executing an IF-THEN operation going back in time, the following are implied: L11 (T−1)=0 at G16; and 13 (T−1)=1, and L6 (T−1)=1 at G11 (T−1).

In this case, no logical contractions have been detected. Thus, the process moves to step D2 (step A5).

Then, in step D2, by the second temporary decided line retrieving device 35, a temporary decided line is retrieved.

In step B1 of FIG. 13, an unestablished gate is retrieved. However, no such gates are detected.

Since no unestablished gates are detected in step B1, no detection is determined in step B2, and the temporary decided line retrieving is finished (step D2).

Subsequently, since no temporary decided lines have been retrieved, the process moves to step D3 (step A7).

In step D3, by the second related failure terminal setting device 26, a related failure terminal is obtained in the input/output terminal of the target gate F17.

In step C1 of FIG. 14, by the failure output terminal retrieving device 261, a failure output terminal, in which logical and expected values are different from each other, is retrieved in the output terminal of the target gate, and L23 (T)=1[0] is thereby obtained.

Since the failure output terminal is detected in step C1 of FIG. 14, the detection is determined in step C2, and the process moves to step C3.

In step C5 of FIG. 14, by the second failure propagation path tracing device 262, the failure propagation path is traced in an input direction, from the starting point which is the failure output terminal L23 (T), until the tracing reaches at the input terminal of the target gate. In this case, L23 (T)=1[0], L16 (T)=0[1], and going back in time L11 (T−1)= 0[1], and L6=1[0] can be traced.

In step C4 of FIG. 14, the related failure gate terminal setting device 263 adds information regarding the related failure terminals (F1, and F2) to the failure input terminal L6 (T−1) in the input side. Note that the related failure terminal has been set in the failure output terminal L23 (T) in the output side of the failure propagation path traced in step C3.

Then, the host a failure location evaluating system receives the newly implied logical values (L1 (T−1)=1[1], L3 (T−1)=1[1] and L6 (T−1)=1[0], and (F1 and F2) as the information of the related failure terminals of L6 (T−1).

By superposing the information of all the gates on one another, failure propagation paths as shown in FIG. 21 and weight of each path can be obtained for the entire logic circuit.

[Fourth Embodiment of the Invention]

Figure 17:
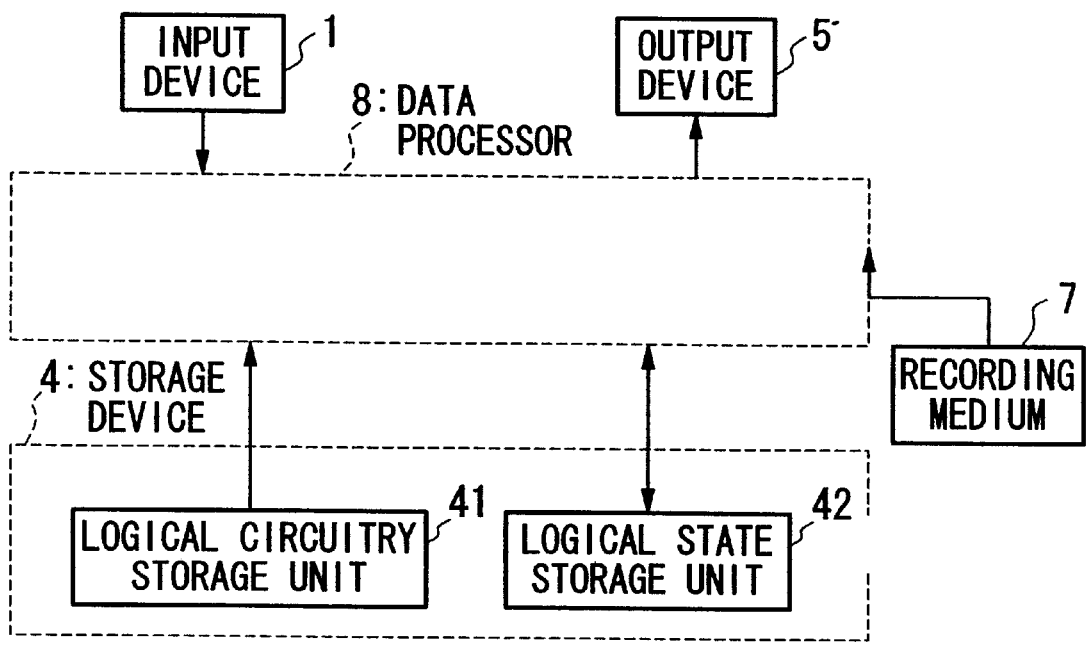
FIG. 17 is a constitutional view of a fourth embodiment of the present invention.

Next, the fourth embodiment of the present invention will be described in detail with reference to the accompanying drawings. As shown in FIG. 17, the fourth embodiment of the invention comprises a recording medium 7, which records a program for the evaluation of the location of a failure. This recording medium 7 may be a magnetic disk, a semiconductor memory or one selected from other types of recording media.

The program for the evaluation of the location of a failure is read from the recording medium 7 through a reader (not shown) and an interface into a data processor 8, and controls the operation of the data processor 8. Based on the control of the program for the evaluation of the location of a failure, the data processor 8 executes processing similar to those of the data processors 2 and 3 described in the first to third embodiments described above. Specifically, the failure location evaluation program stored in the recording medium 7 is used to actuate, in the data processor 2, the evaluating device including the initialization device 21, the input/output state setting device 22, the expected value setting device 23, the logical state setting device 24, the temporary decided line retrieving device 25, and the related failure terminal setting device 26 shown in FIG. 1, alternatively the evaluating device including initialization device 21, the input/output state setting device 22, the expected value setting device 23, the failure propagation path evaluating device 27, and the related failure terminal setting device 26 shown in FIG. 7, otherwise the evaluating device including the initialization device 21, the basic FF retrieving device 31, the input/output state setting device 22, the expected value setting device 23, the logical state evaluating device 24, the second temporary decided line retrieving device 35, and the second related failure terminal setting device 36 shown in FIG. 9. The failure location evaluation program may be downloaded through a communication medium from a server or the like in the data processor 8, and then installed.

When the logical state of the input/output terminal of the target gate from the input device 1 is given, expected and logical values are set in the input/output terminal of the target gate by referring to the circuitry of the gate stored in the logic circuitry storage unit 41.

By referring to the logic circuitry storage unit 41 and the logical state storage unit 42, expected value and logical state inside the circuit of the target gate are evaluated, a signal line, a temporary logical value being set thereon, and a failure output terminal of the logic circuit related to the input/output a failure terminal of the target gate are set, and displayed by the output device 5.

As is apparent from the foregoing detailed description, the invention is advantageous in the following respects.

First, for evaluation of the location of a failure in the logic circuit including the gates defined in a hierarchical manner, it is not necessary to make any particular databases dedicated to such a purpose.

The reason is attributed to the fact that according to the present invention, the evaluation of the location of a failure is carried out by utilizing the library prepared for logic simulation describing the logic circuit composed of the basic gates.

Second, it is possible to retrieve a temporary decided signal line by utilizing the library prepared for the logic simulation describing the logic circuit composed of the basic gates.

The reason is attributed to the fact that according to the present invention, an unestablished gate is retrieved among the gates defined in a hierarchical manner, an input signal line, a logical state thereof being indefinite "U", in the unestablished gate is retrieved, and further the input terminal of the target gate, a temporary logical value being set thereon, is retrieved by tracing a signal line, a logical state thereof being "X" or "U", in an input direction from the retrieved signal lines.

Third, it is possible to set a related failure terminal by utilizing the library prepared for the logic simulation describing the circuitry composed of the basic gates.

The reason is attributed to the fact that according to the present invention, a failure output terminal is retrieved in the hierarchically defined gate, a failure propagation path, in which expected and logical values are different from each other, is traced in an input direction from the failure output terminal, and then information regarding the related failure terminal set in the failure output terminal in the output side of the failure propagation path is added to the failure input path in the input side of the failure propagation path.

Fourth, it is not necessary to make any databases for the evaluation of the location of a failure because the library prepared for the logic simulation is utilized even when the basic FF is included in the hierarchically defined gates.

The reason is attributed to the fact that according to the present invention, processing extending over two time points can be executed by carrying out the following processes, that is, the basic FF is retrieved in the circuit of the hierarchically defined gates; the tracing is continued going back in time by referring to a clock signal when the basic FF is present, in the case of the tracing of the signal line in the temporary decided line retrieval; and further the tracing is continued going back in time by referring to a clock signal when the basic FF is present, in the case of the tracing of the failure propagation path in the related failure terminal setting.

What is claimed is:

1. A failure location evaluating system for evaluating the location of a failure inside a logic circuit by tracing a failure propagation path from a failure terminal, comprising:

expected value setting device for obtaining an expected value of a signal line inside a target gate based on an expected value of an input/output terminal of said target gate, with respect to said target gate having a hierarchically defined circuitry composed of basic gates, evaluation processing being defined therein;

logical state setting device for obtaining a logical state of the signal line inside said target gate based on a logical state of the input/output terminal of said target gate;

temporary decided line retrieving device for retrieving an input/output terminal of a target gate, a temporary logical value being set thereon; and related failure terminal setting device for transmitting information regarding a related failure terminal of the input/output terminal of said target gate to an input side.

2. The failure location evaluating system according to claim 1, wherein said temporary decided line retrieving device comprises:

unestablished gate retrieving device for retrieving an unestablished gate inside said target gate, with respect to said target gate having the hierarchically defined circuitry composed of the basic gates, evaluation processing being defined therein;

temporary decided candidate retrieving device for retrieving an input signal line, a logical state thereof having yet to be unestablished, in said unestablished gate; and temporary decided input terminal retrieving device for retrieving an input terminal of the target gate, a temporary logical value being set thereon, by tracing a signal line, a logical state thereof having yet to be unestablished, from said input signal line in an input direction.

3. The failure location evaluating system according to claim 1, wherein said related failure terminal setting device comprises:

a failure output terminal retrieving device for retrieving a failure output terminal in said target gate, with respect to the target gate having the hierarchically defined circuitry composed of the basic gates, evaluation processing being defined therein;

a failure propagation path tracing device for tracing a failure propagation path, in which expected and logical values differ from each other, from said failure output terminal in an input direction; and related failure gate terminal setting device for adding information regarding a related failure terminal, which is set in an a failure output terminal in an output side of said failure propagation path, to a failure input terminal in an input side of said failure propagation path.

4. The failure location evaluating system according to claim 1, further comprising:

a logic circuitry storage unit for storing a kind of the basic gate, a connecting association between the basic gate and the signal line inside the gate, and an IF-THEN operation rule of said basic gate; and a logical state storage unit for storing a logical state of each signal line being processed, and a logical state of each signal line when a circuit is normal, that is, an expected value, wherein said expected value setting device calculates an expected value inside the target gate composed of the basic gate by referring to an expected value of the input/output terminal entered from an input device, and the circuitry of the target gate stored in the logic circuitry storage unit, at this time, said expected value is obtained by performing an IF-THEN operation in an output direction for obtaining an output state from an input state, and then said expected value is recorded in the logical state storage unit.

5. The failure location evaluating system according to claim 4, wherein said logical state evaluating device calculates a logical state inside the target gate composed of the basic gate by referring to a logical value of the input/output terminal entered from said input device, and the circuitry of the target gate stored in said logic circuitry storage unit, at this time, the logical state is obtained by performing an IF-THEN operation in an input/output direction, and then said obtained logical state is recorded in said logical state storage unit.

6. A failure location evaluating system for evaluating the location of a failure inside a logic circuit by tracing a failure propagation path from a failure terminal, comprising:

expected value setting device for obtaining an expected value of a signal line inside a target gate based on an expected value of an input/output terminal of said target gate, with respect to said target gate having a hierarchically defined circuitry composed of basic gates, evaluation processing being defined therein;

a failure propagation path evaluating device for obtaining all logical states, temporary logical values being set thereon, in the input/output terminal of said target gate by evaluating a failure propagation path inside said target gate; and related failure terminal setting device for transmitting information regarding a related failure terminal of the input/output terminal of said target gate to an input side in the obtained logical states.

7. A failure location evaluating system for evaluating the location of a failure inside a logic circuit by tracing a failure propagation path from a failure terminal, comprising:

basic flip-flop (basic FF) retrieving device for retrieving a position of a basic FF, with respect to a target gate having a hierarchically defined circuitry composed of basic gates and the basic FFs, evaluation processing being defined therein;

expected value setting device for obtaining an expected value of a signal line at two time points inside said target gate based on an expected value of an input/output terminal of said target gate;

logical state setting device for obtaining a logical state of the signal line at two time points inside said target gate based on a logical state of the input/output terminal of said target gate;

second temporary decided line retrieving device for retrieving an input/output terminal of the target gate, a temporary logical value being set thereon, by tracing a signal line having a logical state unestablished over time points in said basic FF; and second related failure terminal setting device for transmitting information regarding a related failure terminal of the input/output terminal of the target gate to an input side by tracing a failure propagation path extending over time points in said basic FF.

8. The failure location evaluating system according to claim 7, wherein said second temporary decided line retrieving device comprises:

unestablished gate retrieving device for retrieving an unestablished gate inside the target gate, with respect to the target gate having the hierarchically defined gate composed of the basic gate, evaluation processing being defined therein;

temporary decided candidate retrieving device for retrieving an input signal line, a logical state thereof having yet to be unestablished, in said unestablished gate; and second temporary decided input terminal retrieving device for tracing the signal line, a logical state thereof having yet to be unestablished, from said input signal line in an input direction by referring to a clock signal of the basic FF and a logical state at two time points inside the target gate, and then retrieving an input terminal of the target gate, a temporary logical value being set thereon.

9. The failure location evaluating system according to claim 7, wherein said second related failure terminal setting device comprises:

a failure output terminal retrieving device for retrieving a failure output terminal in the target gate, with respect to the target gate having the hierarchically defined circuitry composed of the basic gates, evaluation processing being defines therein;

second failure propagation path tracing device for tracing a failure propagation path extending over two time points by referring to a clock signal of said basic FF, and then tracing a failure propagation path, in which the expected value and the logical value are different from each other, from a failure output terminal in an input direction; and related failure gate terminal setting device for adding information regarding a related failure terminal, which is set in the failure output terminal in an output side of said failure propagation path, to a failure input terminal in an input side of said failure propagation path.

10. A failure location evaluating method for evaluating the location of a failure inside a logic circuit by tracing a failure propagation path from a failure terminal, comprising the steps of:

obtaining an expected value of a signal line inside a target gate based on an expected value of an input/output terminal of said target gate, with respect to the target gate having a hierarchically defined circuitry composed of basic gates, evaluation processing being defined therein, and then storing the obtained expected value in a storage unit;

obtaining a logical state of the signal line inside said target gate based on a logical state of the input/output terminal of said target gate, and then storing the obtained logical state in the storage unit;

retrieving an input terminal of the target gate, a temporary logical value being set thereon, by referring to the circuitry of the target gate and the expected and logical values inside the target gate, which are stored in the respective storage units; and transmitting information regarding a related failure terminal of the input/output terminal of said target gate to an input side.

11. The failure location evaluating method according to claim 10, wherein said step of retrieving the input/output terminal of the target gate, a temporary logical value being set thereon, comprises the steps of:

retrieving an unestablished gate inside said target gate, with respect to the target gate having the hierarchically defined circuitry composed of the basic gates, evaluation processing being defined therein;

retrieving an input signal line, a logical state thereof having yet to be unestablished, in the unestablished gate; and tracing a signal line, a logical state thereof having yet to be unestablished, from said input signal line in an input direction, and then retrieving an input terminal of the target gate for setting a temporary logical value.

12. The failure location evaluating method according to claim 10, wherein said step of transmitting the information regarding the related failure terminal of the input/output terminal of the target gate to the input side comprises the steps of:

retrieving a failure output terminal in the target gate, with respect to the target gate having the hierarchically defined circuitry composed of the basic gates, evaluation processing being defined therein;

tracing a failure propagation path, in which the expected value and the logical value differ from each other, from said failure output terminal in an input direction; and adding information regarding a related failure terminal, which is set in the failure output terminal in an output side of said failure propagation path, to a failure input terminal in an input side of said failure propagation path.

13. A failure location evaluating method for evaluating the location of a failure inside a logic circuit by tracing a failure propagation path from a failure terminal, comprising the steps of:

obtaining an expected value of a signal line inside a target gate based on an expected value of an input/output terminal of said target gate, with respect to the target gate having a hierarchically defined circuitry composed of basic gates, evaluation processing being defined therein, and then storing the obtained expected value in a storage unit;

evaluating a failure propagation path inside said target gate by referring to the circuitry of the target gate, a logical state of the input/output terminal, and a temporary decided level, which are stored in the storage unit, obtaining a logical state for setting a temporary logical value in the input/output terminal of said target gate, and then storing the obtained logical state in said storage unit; and transmitting information regarding a related failure terminal of the input/output terminal of the target gate to an input side in the obtained logical state.

14. A failure location evaluating method for evaluating the location of a failure inside a logic circuit by tracing a failure propagation path from a failure terminal, comprising the steps of:

retrieving a position of a basic flip-flop (basic FF) in a target gate, with respect to the target gate having a hierarchically defined circuitry composed of basic gates and said basic FFs, evaluation processing being defined therein;

obtaining an expected value of a signal line at two time points inside said target gate based on an expected value of an input/output terminal of said target gate, and then storing the obtained expected value in a storage unit;

obtaining a logical state of the signal line at two time points inside the target gate based on a logical state of the input/output terminal of said target gate, and then storing the obtained logical state in the storage unit;

tracing a signal line, a logical state thereof having yet to be unestablished over two time points, in said basic FF, by referring to the circuitry of the target gate, the expected value and the logical state at two time points inside said target gate, which are stored in the respective storage units, and then retrieving an input/output terminal of the target gate, a temporary logical value being set thereon; and transmitting information regarding a related failure terminal of the input/output terminal of said target gate to an input side by tracing a failure propagation path extending over time points in the basic FF.

15. The failure location evaluating method according to claim 14, wherein said step of retrieving the input/output terminal of the target gate, a temporary logical value being set thereon, comprises the steps of:

retrieving an unestablished gate inside said target gate, with respect to the target gate having the hierarchically defined circuitry composed of the basic gates, evaluation processing being defined therein;

retrieving an input signal line, a logical state thereof having yet to be unestablished, in said unestablished gate; and tracing a signal line, a logical state thereof having yet to be unestablished, from said input signal line in an input direction by referring to a clock signal of the basic FF and the logical state at two time points inside the target gate, and then retrieving the input terminal of the target gate for setting a temporary logical value.

16. The failure location evaluating method according to claim 14, wherein said step of transmitting the information regarding the related failure terminal of the input/output terminal of said target gate to the input side comprises the steps of:

retrieving a failure output terminal in said target gate, with respect to the target gate having the hierarchically defined circuitry composed of the basic gates, evaluation processing being defined therein;

tracing a failure propagation path extending over two time points by referring to a clock signal of the basic FF, and then tracing a failure propagation path, in which the expected value and the logical value are different from each other, from the failure output terminal in an input direction; and adding information regarding a related failure terminal set in a failure output terminal in an output side of said failure propagation path to a failure input terminal in an input side of said propagation path.

17. A machine-readable recording medium in a failure location evaluating system adapted to evaluate the location of a failure inside a logic circuit by tracing a failure propagation path from a failure terminal, said recording medium comprising:

programs recorded to cause a computer to execute operations, wherein said operations include:

(a) expected value setting processing for obtaining an expected value of a signal line inside a target gate based on an expected value of an input/output terminal of said target gate, the target gate having a hierarchically defined circuitry composed of basic gates, evaluation processing being defined therein, and then storing the obtained expected value in a storage unit;

(b) logical state setting processing for obtaining a logical state of the signal line inside said target gate based on a logical state of the input/output terminal of said target gate, and then storing the obtained logical state in the storage unit;

(c) temporary decided line retrieving processing for retrieving an input/output terminal of the target gate, a temporary logical value being set thereon, by referring to the circuitry of the target gate and the logical state of the input/output terminal, which are stored in the respective storage units; and (d) related failure terminal setting processing for transmitting information regarding a related failure terminal of the input/output terminal of said target gate to an input side.

18. A machine-readable recording medium in a failure location evaluating system adapted to evaluate the location of a failure inside a logic circuit by tracing a failure propagation path from a failure terminal, said recording medium comprising:

programs recorded to cause a computer to execute operations, wherein said operations include:

(a) expected value setting processing for obtaining an expected value of a signal line inside a target gate based on an expected value of an input/output terminal of the target gate, with respect to the target gate having a hierarchically defined circuitry composed of basic gates, evaluation processing being defined therein, and then storing the obtained expected value in a storage unit;

(b) a failure propagation path evaluating processing for evaluating a failure propagation path inside said target gate by referring to the circuitry of the target gate, the expected value and a logical state inside the target gate, and a temporary decided level, which are stored in the storage unit, obtaining a logical state of an input/output terminal of the target gate, a temporary logical state being set thereon, and then storing the obtained logical state in the storage unit; and (c) related failure terminal setting processing for transmitting information regarding a related failure terminal of the input/output terminal of said target gate to an input side in the obtained logical state.

19. A machine-readable recording medium in a failure location evaluating system adapted to evaluate the location of a failure inside a logic circuit by tracing a failure propagation path from a failure terminal, said recording medium comprising:

programs recorded to cause a computer to execute operations, wherein said operations include:

(a) basic flip-flop (basic FF) retrieving processing for retrieving a position of a basic FF, with respect to a target gate having a hierarchically defined circuitry composed of basic gates and the basic FFs, evaluation processing being defined therein;

(b) expected value setting processing for obtaining an expected value of a signal line at two time points inside said target gate based on an expected value of an input/output terminal of the target gate, and then storing the obtained expected value in a storage unit;

(c) logical state setting processing for obtaining a logical state of the signal line at two time points inside said target gate based on a logical state of the input/output terminal of said target gate, and then storing the obtained logical state in the storage unit;

(d) second decided line retrieving processing for tracing a signal line, a logical state thereof having yet to be unestablished in the basic FF, by referring to the circuitry of the target gate, the expected value and the logical state at two time points inside said target gate, which are stored in the respective storage units, and then retrieving an input/output terminal of the target gate, a temporary logical value being set thereon; and (e) second related failure terminal setting processing for transmitting information regarding a related failure terminal of the input/output terminal of said target gate to an input side by tracing a failure propagation path extending over two time points in said basic FF.

20. A device for evaluating the location of a failure, comprising:

an input device;

an output device;

a storage device; and a data processor, wherein said storage device includes:

a logic circuitry storage unit for storing a kind of a basic gate, a connecting relation between the basic gate and a signal line inside a gate, and a rule of an IF-THEN operation for said basic gate; and a logical state storage unit for storing a logical state of each signal line being processed, and a logical state of each signal line when a circuit is normal, that is, an expected value, and said data processor includes:

an initialization unit for selecting the logic circuitry by referring to said logic circuitry storage unit based on a kind of the target gate provided from said input device, and then executing initialization;

an input/output state setting unit for setting expected and logical values of an input/output terminal of said target gate and related failure terminal information, provided from said input device, to an input/output terminal of the circuitry by referring to said logic circuitry storage unit, and then recording the same in said logical state storage unit;

an expected value setting unit for executing an IF-THEN operation in an output direction for obtaining an output state in accordance with an input state to obtain an expected value inside the target gate composed of a basic gate by referring to the expected value of the input/output terminal set by said input/output state setting unit and recorded in said logical state storage unit, and the logic circuitry storage unit, and then recording the obtained expected value in said logical state storage unit;

a logical state evaluating unit for calculating a logical state inside the target gate composed of the basic gate by referring to the logical value set by said input/output state setting unit and recorded in said logical state storage unit, and the logic circuitry storage unit, and then recording the calculated logical state in the logical state storage unit, the calculation of said logical state being processed by executing an IF-THEN operation in an input/output direction;

a temporary decided line retrieving unit for retrieving an input terminal, a temporary logical value being set thereon, by referring to the circuitry of the target gate recorded in said logic circuitry storage unit, and the expected value and the logical state inside the target gate recorded in said logical state storage unit, and then outputting the obtained input terminal of the target gate, a temporary logical value being set thereon, to said output device; and a related failure terminal setting unit for obtaining a related failure terminal in the input/output terminal of said target gate by referring to the circuitry of the target gate recorded in said logic circuitry storage unit, and the expected value and the logical state inside the target gate recorded in the logical state storage unit, and then outputting the obtained related failure terminal to said output device.

21. The device for evaluating the location of a failure according to claim 20, wherein said temporary decided line retrieving unit comprises:

an unestablished gate retrieving portion for retrieving an unestablished gate having an output terminal connected to a failure propagation path, by referring to the circuitry and the rule of an IF-THEN operation for the basic gate recorded in said logic circuitry storage unit, and the logical value of each signal line inside the target gate stored in said logical state storage unit;

a temporary decided candidate retrieving portion for retrieving an input terminal, a logical state having yet to be unestablished, as a temporary decided candidate, in the unestablished gate retrieved by said unestablished gate retrieving portion by referring to said logic circuitry and logical state storage units; and a temporary decided input terminal retrieving portion for tracing a signal line, a logical state thereof having yet to be unestablished, in an input direction from the temporary decided candidate terminal, retrieved by said temporary decided candidate retrieving portion, until the tracing reaches at an input terminal of the target gate, in a circuit of the target gate by referring to the logic circuitry and logical state storage units, and then setting one of reached input terminals of the target gate serving as a temporary decided terminal.

22. The device for evaluating the location of a failure according to claim 20, wherein said related failure terminal setting unit comprises:

a failure output terminal retrieving portion for retrieving a failure output terminal, in which the logical value and expected values are different from each other in an output of an output terminal of the target gate, by referring to the circuitry recorded in said logic circuitry storage unit, and the logical and expected values of the target gate stored in said logical state storage unit;

a failure propagation path tracing portion for tracing said failure propagation path in an input direction from the starting point which is the failure output terminal retrieved by said failure output terminal retrieving portion until the tracing reaches at an input terminal of the target gate, by referring to said logic circuitry storage unit and said logical state storage unit; and a related failure gate terminal setting portion for adding information regarding a related failure terminal set in a failure output terminal in an output side of said failure propagation path, traced by said failure propagation path tracing portion, to a failure input terminal in an input side by referring to said logic circuitry storage unit and said logical state storage unit.

23. A device for evaluating the location of a failure, comprising:

an input device;

an output device;

a storage device; and a data processor, wherein said storage device includes:

a logic circuitry storage unit for storing a kind of a basic gate, a connecting relation between the basic gate and a signal line inside a gate, and a rule of an IF-THEN operation for said basic gate;

a logical state storage unit for storing a logical state of each signal line being processed, and a logical state of each signal line when a circuit is normal, that is, an expected value; and a temporary decided state storage unit for storing a temporary decided level at a point of time when a logical state of each signal line is evaluated by an IF-THEN operation, and said data processor includes:

an initialization unit for selecting the logic circuitry by referring to said logic circuitry storage unit based on a kind of the target gate provided from said input device, and then executing initialization;

an input/output state setting unit for setting expected and logical values of an input/output terminal of said target gate and related failure terminal information, which are provided from said input device, in an input/output terminal of the circuitry of the target gate by referring to logic circuitry storage unit, and then recording the same in said logical state storage unit;

an expected value setting unit for executing an IF-THEN operation in an output direction for obtaining an output state in accordance with an input state to obtain an expected value inside the target gate composed of a basic gate by referring to the expected value of the input/output terminal set by said input/output state setting unit and recorded in said logical state storage unit, and the logic circuitry storage unit, and then recording the obtained expected value in said logical state storage unit;

a logical state evaluating unit for calculating a logical state inside the target gate composed of the basic gate by referring to the logical value of the input/output terminal set by said input/output state setting unit and then recorded in said logical state storage unit, and the logic circuitry storage unit, and recording the calculated logical state in the logical state storage unit, the calculation of the logical state being processed by executing an IF-THEN operation in an input/output direction;

a failure propagation path evaluating unit for updating a temporary decided level of said temporary decided state storage unit and the logical state inside the target gate in said logical state storage unit by referring to the circuitry of the target gate recorded in said logic circuitry storage unit, and the logical state of the input/output terminal recorded in said logical state storage unit, and then obtaining all failure propagation paths satisfying the logical state of the input/output terminal provided as an initial value; and a related failure terminal setting unit for obtaining said related failure terminal in each a failure propagation path obtained by said failure propagation path evaluating unit by referring to the circuitry of the target gate recorded in said logic circuitry storage unit, and the expected value and the logical state inside the target gate, recorded in said logical state storage unit, and then outputting the obtained related failure terminal to said output device.

24. A device for evaluating the location of a failure, comprising:

an input device;

an output device;

a storage device; and a data processor, wherein said storage device includes:

a logic circuitry storage unit for storing a kind of a basic gate, a connecting relation between the basic gate and a signal line inside a gate, and a rule of an IF-THEN operation for said basic gate; and a logical state storage unit for storing a logical state of each signal line being processed, and a logical state of each signal line when a circuit is normal, i.e., an expected value, and said data processor includes:

an initialization unit for selecting the logic circuitry by referring to said logic circuitry storage unit based on a kind of the target gate provided from said input device, and then executing initialization;

a basic flip-flop (basic FF) retrieving unit for retrieving a basic FF in a circuit of the target gate by referring to said logic circuitry storage unit, and then recording a position of the basic FF inside the circuit in said logic circuitry storage unit;

an input/output state setting unit for setting expected and logical values of an input/output terminal of the target gate at two time points and related failure terminal information, provided from the input device, to an input/output terminal of the circuitry by referring to said logic circuitry storage unit, and then recording the same in said logical state storage unit;

an expected value setting unit for calculating expected values at two time points inside the target gate composed of the basic gate by referring to the expected values of the input/output terminal at two time points set by said input/output state setting unit and recorded in said logical state storage unit, and said logic circuitry storage unit, and then recording the obtained values in said logical state storage unit, at this time, the calculation being processed by executing an IF-THEN operation over two time points in an output direction for obtaining an output state in accordance with an input state;

a logical state setting unit for calculating a logical state at two time points inside the target gate composed of the basic gate by referring to the logical value of the input/output terminal set by said input/output state setting unit of the logical state evaluating unit and recorded in the logical state storage unit, and said logic circuitry storage unit, and then recording the same in said logical state storage unit, the calculation of the logical state being processed by executing an IF-THEN operation in an input/output direction;

a second temporary decided line retrieving unit for retrieving an input terminal, a temporary logical value being set thereon, by referring to the circuitry of the target gate recorded in said logic circuitry storage unit, and the expected value and the logical state at two time points inside the target gate recorded in said logical state storage unit, and then outputting the obtained input terminal, a temporary logical value being set thereon, to said output device; and a second related failure terminal setting unit for obtaining a related failure terminal in the input/output terminal of the target gate by referring to the circuitry of the target gate recorded in said logic circuitry storage unit, and the expected value and the logical state at two time points inside the target gate recorded in the logical state storage unit, and then outputting the obtained related failure terminal to said output device.

25. The device for evaluating the location of a failure according to claim 24, wherein said second temporary decided line retrieving unit includes:

an unestablished gate retrieving portion for retrieving an unestablished gate having an output terminal connected to a failure propagation path with respect to the logical state at two time points, by referring to the circuitry and the rule of an IF-THEN operation for the basic gate recorded in said logic circuitry storage unit, and the logical value of each signal line inside the target gate recorded in said logical state storage unit;

a temporary decided candidate retrieving portion for retrieving an input terminal, a logical state thereof having yet to be unestablished, as a temporary decided candidate, in the unestablished gate retrieved by said unestablished gate retrieving portion by referring to said logic circuitry storage unit and said logical state storage unit; and a second temporary decided input terminal retrieving portion for tracing a signal line, a logical state thereof having yet to be unestablished, from [then] input terminal of the unestablished gate serving as a temporary decided candidate in an input direction in a circuit of the target gate until the tracing reaches at an input terminal of the target gate, by referring to said logic circuitry storage unit and said logical state storage unit, and then setting one of the reached input terminals of the target gate serving as a temporary decided terminal, at this time, when encountering an output terminal of the basic FF during the tracing, determining whether the process goes back in time by referring to a clock signal of said basic FF, alternatively the tracing is finished by referring to a position of the basic FF retrieved by the basic FF retrieving unit and recorded in said logic circuitry storage unit.

26. The device for evaluating the location of a failure according to claim 24, wherein said second related failure terminal setting units includes:

a failure output terminal retrieving portion for retrieving a failure output terminal, in which logical and expected values are different from each other in an output terminal of the target gate, by referring to the circuitry recorded in said logic circuitry storage unit, and the logical and expected values of the target gate stored in said logical state storage unit;

a second failure propagation path tracing portion for tracing a failure propagation path in an input direction, from the starting points which are the failure output terminals at two time points retrieved by said failure output terminal retrieving portion serving, until the tracing reaches at an input terminal of the target gate, by referring to said logic circuitry storage unit and logical state storage unit, at this time, when encountering an output terminal of said basic FF during the tracing, determining whether the process goes back in time by referring to the clock signal of said basic FF, alternatively the tracing is finished by referring to the position of the basic FF retrieved by said basic FF retrieving unit and recorded in said logic circuitry storage unit; and a related failure gate terminal setting portion for adding information regarding a related failure terminal set in a failure output terminal in an output side of the failure propagation path, traced by said second failure propagation path tracing portion, to a failure input terminal in an input side, by referring to said logic circuitry storage unit and said logical state storage unit.

* * * * *

UNITED STATES PATENT AND TRADEMARK OFFICE
CERTIFICATE OF CORRECTION

PATENT NO.   : 6,697,981 B2
DATED        : February 24, 2002
INVENTOR(S)  : Kazuki Shigeta It is certified that error appears in the above-identified patent and that said Letters Patent is hereby corrected as shown below:

<u>Column 17,</u>
Line 11, delete "13=1" insert -- L3=1 --.

Signed and Sealed this

Fifth Day of October, 2004

JON W. DUDAS
*Director of the United States Patent and Trademark Office*